United States Patent
Patil et al.

(10) Patent No.: US 12,243,855 B2
(45) Date of Patent: Mar. 4, 2025

(54) PACKAGE COMPRISING CHANNEL INTERCONNECTS LOCATED BETWEEN SOLDER INTERCONNECTS

(71) Applicant: QUALCOMM Incorporated, San Diego, CA (US)

(72) Inventors: Aniket Patil, San Diego, CA (US); Durodami Lisk, San Diego, CA (US); Hong Bok We, San Diego, CA (US); Charles David Paynter, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 359 days.

(21) Appl. No.: 17/532,754

(22) Filed: Nov. 22, 2021

(65) Prior Publication Data
US 2023/0163113 A1 May 25, 2023

(51) Int. Cl.
| | |
|---|---|
| H01L 25/10 | (2006.01) |
| H01L 23/00 | (2006.01) |
| H01L 23/498 | (2006.01) |
| H01L 25/00 | (2006.01) |

(52) U.S. Cl.
CPC ...... *H01L 25/105* (2013.01); *H01L 23/49816* (2013.01); *H01L 23/49822* (2013.01); *H01L 24/16* (2013.01); *H01L 25/50* (2013.01); *H01L 2224/16227* (2013.01)

(58) Field of Classification Search
None
See application file for complete search history.

(56) References Cited

U.S. PATENT DOCUMENTS

| | | | | |
|---|---|---|---|---|
| 7,586,183 | B2* | 9/2009 | Kawabata | H01L 25/105 257/777 |
| 2003/0222282 | A1* | 12/2003 | Fjelstad | H01L 23/49805 257/200 |
| 2006/0231939 | A1 | 10/2006 | Kawabata et al. | |
| 2010/0019382 | A1* | 1/2010 | Miwa | H01L 23/49838 257/737 |
| 2018/0157782 | A1* | 6/2018 | Rossi | H01L 24/00 |

OTHER PUBLICATIONS

International Search Report and Written Opinion—PCT/US2022/048192—ISA/EPO—Feb. 27, 2023.

* cited by examiner

*Primary Examiner* — Hung K Vu
(74) *Attorney, Agent, or Firm* — Loza & Loza, LLP

(57) ABSTRACT

A device comprising a first package and a second package coupled to the first package through a first plurality of solder interconnects. The first package includes a first substrate comprising at least one first dielectric layer and a first plurality of interconnects, and a first integrated device coupled to the first substrate. The second package includes a second substrate comprising at least one second dielectric layer and a second plurality of interconnects, a second integrated device coupled to a first surface of the second substrate, a third integrated device coupled to the first surface of the second substrate through a second plurality of solder interconnects and a first plurality of channel interconnects coupled to the first surface of the second substrate, wherein the first plurality of channel interconnects is located between solder interconnects from the second plurality of solder interconnects.

20 Claims, 21 Drawing Sheets

CROSS SECTIONAL PROFILE VIEW

CROSS SECTIONAL PROFILE VIEW

CROSS SECTIONAL PROFILE VIEW

PLAN VIEW

CROSS SECTIONAL PROFILE VIEW

AA CROSS SECTION

PLAN VIEW

PLAN VIEW

CROSS SECTIONAL PROFILE VIEW

PACKAGE COMPRISING CHANNEL INTERCONNECTS LOCATED BETWEEN SOLDER INTERCONNECTS

FIELD

Various features relate to packages with integrated devices.

BACKGROUND

A package may include a substrate and integrated devices. These components are coupled together to provide a package that may perform various electrical functions. There is an ongoing need to provide better performing packages and reduce the overall size of packages.

SUMMARY

Various features relate to packages with an integrated device.

One example provides a device comprising a first package and a second package coupled to the first package through a first plurality of solder interconnects. The first package includes a first substrate comprising at least one first dielectric layer and a first plurality of interconnects, and a first integrated device coupled to the first substrate. The second package includes a second substrate comprising at least one second dielectric layer and a second plurality of interconnects, a second integrated device coupled to a first surface of the second substrate, a third integrated device coupled to the first surface of the second substrate through a second plurality of solder interconnects and a first plurality of channel interconnects coupled to the first surface of the second substrate, wherein the first plurality of channel interconnects is located between solder interconnects from the second plurality of solder interconnects.

Another example provides an apparatus comprising a first package and a second package coupled to the first package through a first plurality of solder interconnects. The first package includes a first substrate comprising at least one first dielectric layer and a first plurality of interconnects, and a first integrated device coupled to the first substrate. The second package includes a second substrate comprising at least one second dielectric layer and a second plurality of interconnects, a second integrated device coupled to a first surface of the second substrate, a third integrated device coupled to the first surface of the second substrate through a second plurality of solder interconnects and a means for channel interconnections coupled to the first surface of the second substrate, wherein the means for channel interconnections is located between solder interconnects from the second plurality of solder interconnects.

Another example provides a method for fabricating a package. The method provides a first package comprising a first substrate comprising at least one first dielectric layer and a first plurality of interconnects, and a first integrated device coupled to the first substrate. The method couples a second substrate to the first substrate through a first plurality of solder interconnects, wherein the second substrate comprises at least one second dielectric layer and a second plurality of interconnects. The method provides a first plurality of channel interconnects over a first surface of the second substrate. The method couples a second integrated device to the first surface of the second substrate. The method couples a third integrated device to the first surface of the second substrate through a second plurality of solder interconnects, wherein the first plurality of channel interconnects is located between solder interconnects of the second plurality of solder interconnects.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising a first package and a second package coupled to the first package through a first plurality of solder interconnects. The first package includes a first substrate comprising at least one first dielectric layer and a first plurality of interconnects, and a first integrated device coupled to the first substrate. The second package includes a second substrate comprising at least one second dielectric layer and a second plurality of interconnects, a second integrated device coupled to a first surface of the second substrate, a third integrated device coupled to the first surface of the second substrate through a second plurality of solder interconnects and a first plurality of channel interconnects coupled to the first surface of the second substrate, wherein the first plurality of channel interconnects is located between solder interconnects from the second plurality of solder interconnects. As will be further described below, the use of the first plurality of channel interconnects between solder interconnects helps (i) improve signal isolation in the package, (ii) untangle signal routes, (iii) reduce package thickness, (iv) improve heat dissipation, and/or (v) improve fabrication lead times.

Exemplary Package Comprising Channel Interconnects

Figure 1:
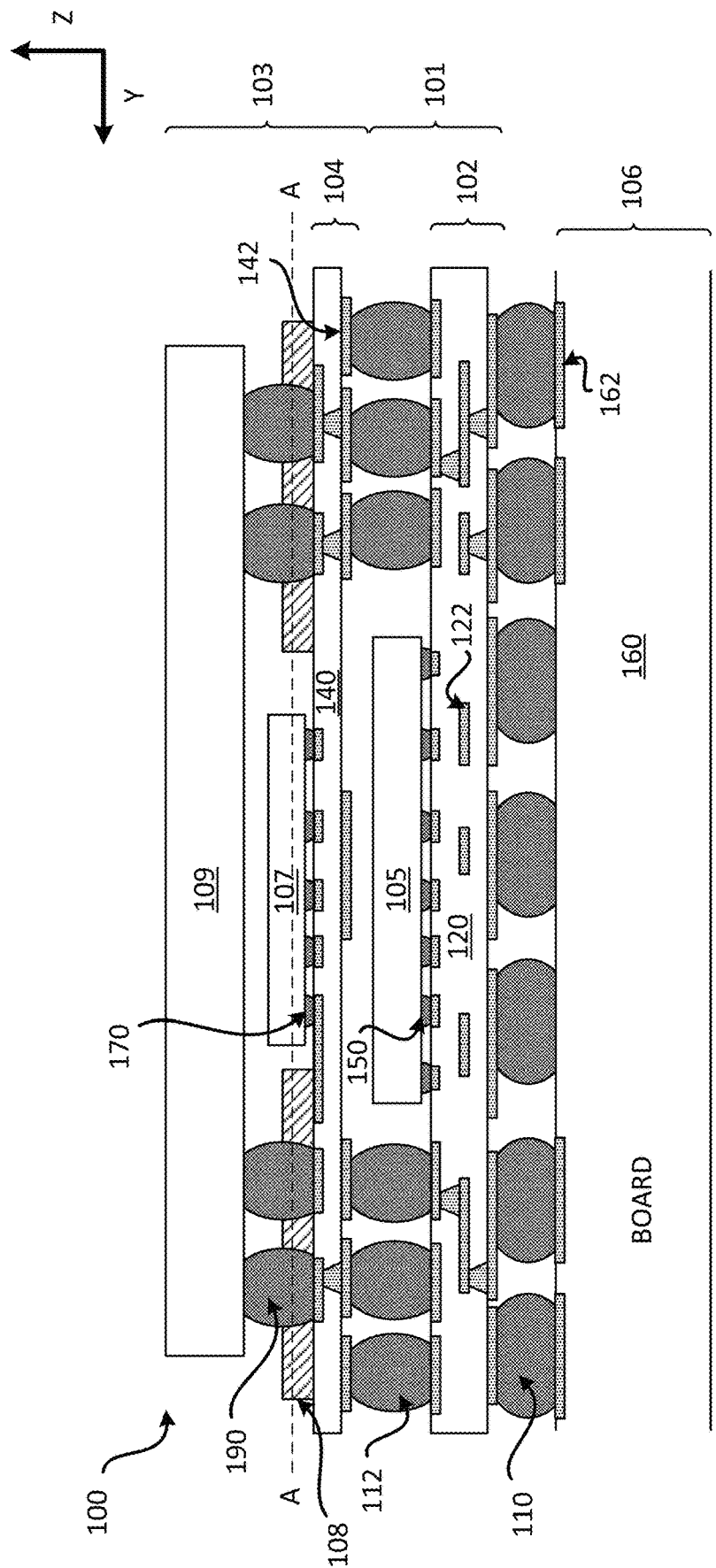
FIG. 1 illustrates an exemplary cross sectional profile view of a package that includes channel interconnections.

FIG. 1 illustrates a cross sectional profile view of a package 100 that includes channel interconnects. The package 100 may be a package on package (PoP). The package 100 may include a first package 101 and a second package 103. The package 100 is coupled to a board 106 through a plurality of solder interconnects 110. The board 106 includes at least one board dielectric layer 160 and a plurality of board interconnects 162. The board 106 may include a printed circuit board (PCB).

The first package 101 includes a first substrate 102 and a first integrated device 105. The first integrated device 105 is coupled to a first surface (e.g., top surface) of the substrate 102, through a plurality of solder interconnects 150. The first substrate 102 includes at least one first dielectric layer 120 and a first plurality of interconnects 122. The first integrated device 105 is coupled to the first plurality of interconnects 122 of the first substrate 102, through the plurality of solder interconnects 150.

The second package 103 includes a second substrate 104, a second integrated device 107, a third integrated device 109 and a plurality of channel interconnections 108. The second integrated device 107 is coupled to a first surface (e.g., top surface) of the second substrate 104, through a plurality of solder interconnects 170. The third integrated device 109 is coupled to the first surface (e.g., top surface) of the second substrate 104, through a plurality of solder interconnects 190. The second integrated device 107 is located between the second substrate 104 and the third integrated device 109. The second integrated device 107 is located underneath the third integrated device 109. The plurality of solder interconnects 190 may laterally surround the second integrated device 107.

The plurality of channel interconnections 108 is located over the first surface (e.g., top surface) of the second substrate 104. It is noted that the plurality of channel interconnections 108 shown in FIG. 1 represents a conceptual representation of possible channel interconnects. As will be further described below in at least FIGS. 4-9, the plurality of channel interconnections 108 may be implemented as and/or include a plurality of channel interconnects, a channel substrate (e.g., fourth substrate, patch substrate) and/or a flexible cable (e.g., flexible substrate, flexible board). The plurality of channel interconnections 108 may be a means for channel interconnection. At least one channel interconnections from the plurality of channel interconnections 108 is located between adjacent solder interconnects from the plurality of solder interconnects 190. The plurality of channel interconnections 108 may extend underneath the third integrated device 109.

The plurality of channel interconnections 108 between solder interconnects helps (i) improve signal isolation in the package, (ii) untangle signal routes, (iii) reduce package thickness, (iv) improve heat dissipation, and/or (v) improve fabrication lead times. For example, some signals may be configured to travel through an electrical path that includes the plurality of channel interconnections 108 so that these signals don't interfere with other signals. In some implementations, signals to and/or from the integrated device 107 may be configured to travel through an electrical path that includes the plurality of channel interconnections 108 so that these signals do not interfere and/or are isolated from signals that travel between the integrated device 105 and the integrated device 109. This can lead to improved performances for the integrated device 105, the integrated device 107, the integrated device 109 and/or the package 100. Some electrical paths may include the plurality of channel interconnections 108 to reduce congestion and untangle routes in the second substrate 104. The use of plurality of channel interconnections 108 may reduce the number of metal layers in the second substrate 104, which may help reduce the overall thickness of the second substrate 104 and/or the package 100. Using a substrate with less metal layers helps improve heat dissipation in the package 100, which can help improve the overall performance of the package 100.

In some implementations, the overall thickness of the second substrate 104, the plurality of solder interconnects 112, the first substrate 102 and the plurality of solder interconnects 110 may be about 510 micrometers or less. The second substrate 104 includes at least one second dielectric layer 140 and a second plurality of interconnects 142. The second substrate 104 may be an interposer. In some implementations, the second substrate 104 may have 2 metal layers or less. The third integrated device 109 is coupled to the second plurality of interconnects 142 of the second substrate 104, through the plurality of solder interconnects 190. The second integrated device 107 is coupled to the second plurality of interconnects 142 of the second substrate 104, through the plurality of solder interconnects 170. The second package 103 is coupled to the first package 101 through the plurality of solder interconnects 112. For example, the second substrate 104 is coupled to the first substrate 102 through the plurality of solder interconnects 112. The plurality of solder interconnects 112 may be considered part of the first package 101 and/or the second package 103.

Figure 2:
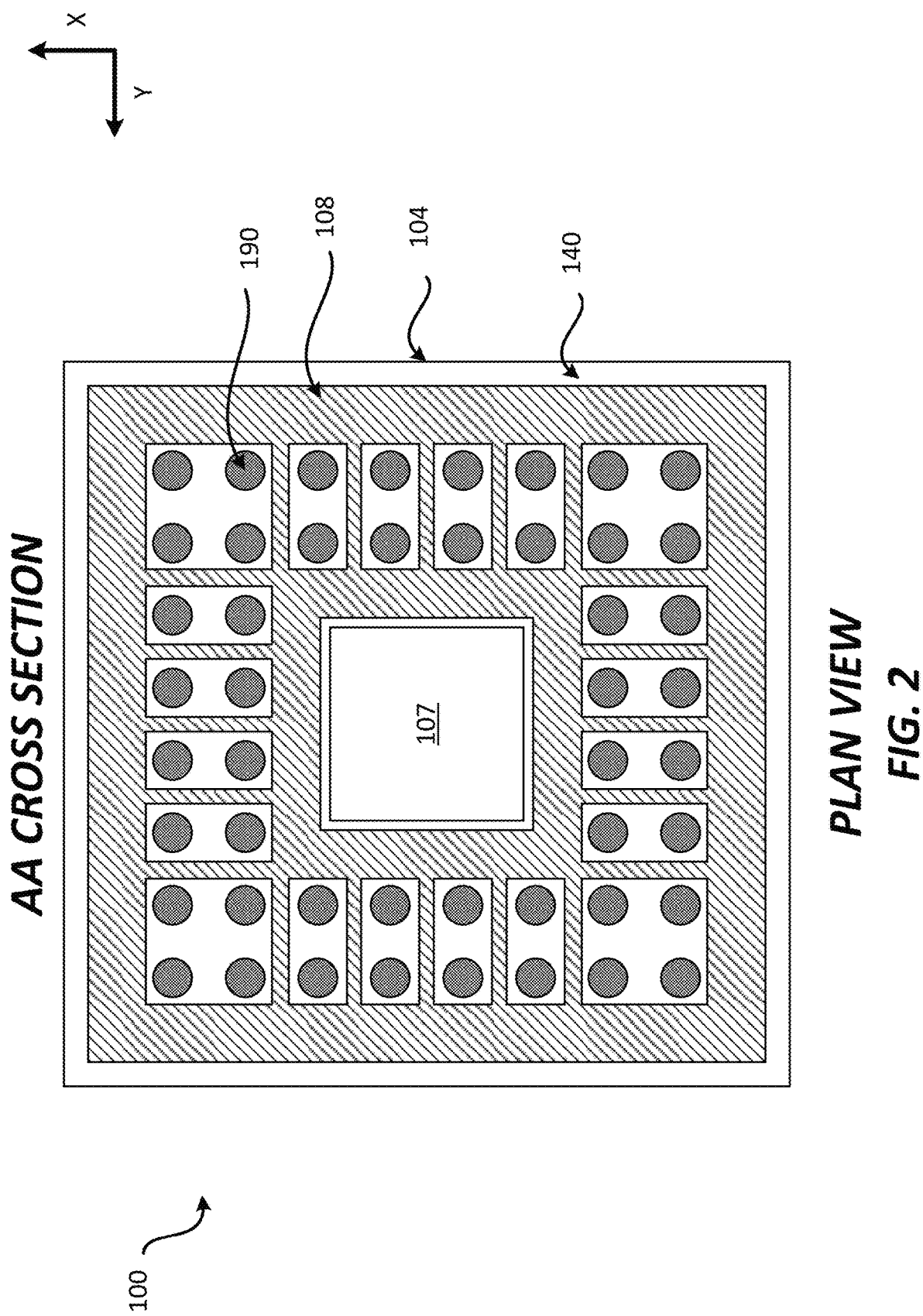
FIG. 2 illustrates an exemplary cross sectional plan view of a package that includes channel interconnections.

FIG. 2 illustrates a plan view across an AA cross section of the package 100. FIG. 2 illustrates the second substrate 104, the second integrated device 107, the plurality of solder interconnects 190, and the plurality of channel interconnections 108. As shown in FIG. 2, at least one channel interconnections from the plurality of channel interconnections 108 is located between adjacent solder interconnects from the plurality of solder interconnects 190. The plurality of channel interconnections 108 is located over the second substrate 104. The plurality of channel interconnections 108 may conceptually represent a region where channel interconnects may be implemented and/or located in the package 100. FIG. 2 conceptually shows the plurality of channel interconnections 108 as one component. However, the plurality of channel interconnections 108 may be provided as one or more components. The plurality of channel interconnections 108 may laterally surround the second integrated device 107. The plurality of channel interconnections 108 may include one or more metal layers (e.g., one metal layer, two metal layers) to accommodate various interconnections needs and/or designs. The plurality of solder interconnects 190 may laterally surround the second integrated device 107.

Figure 3:
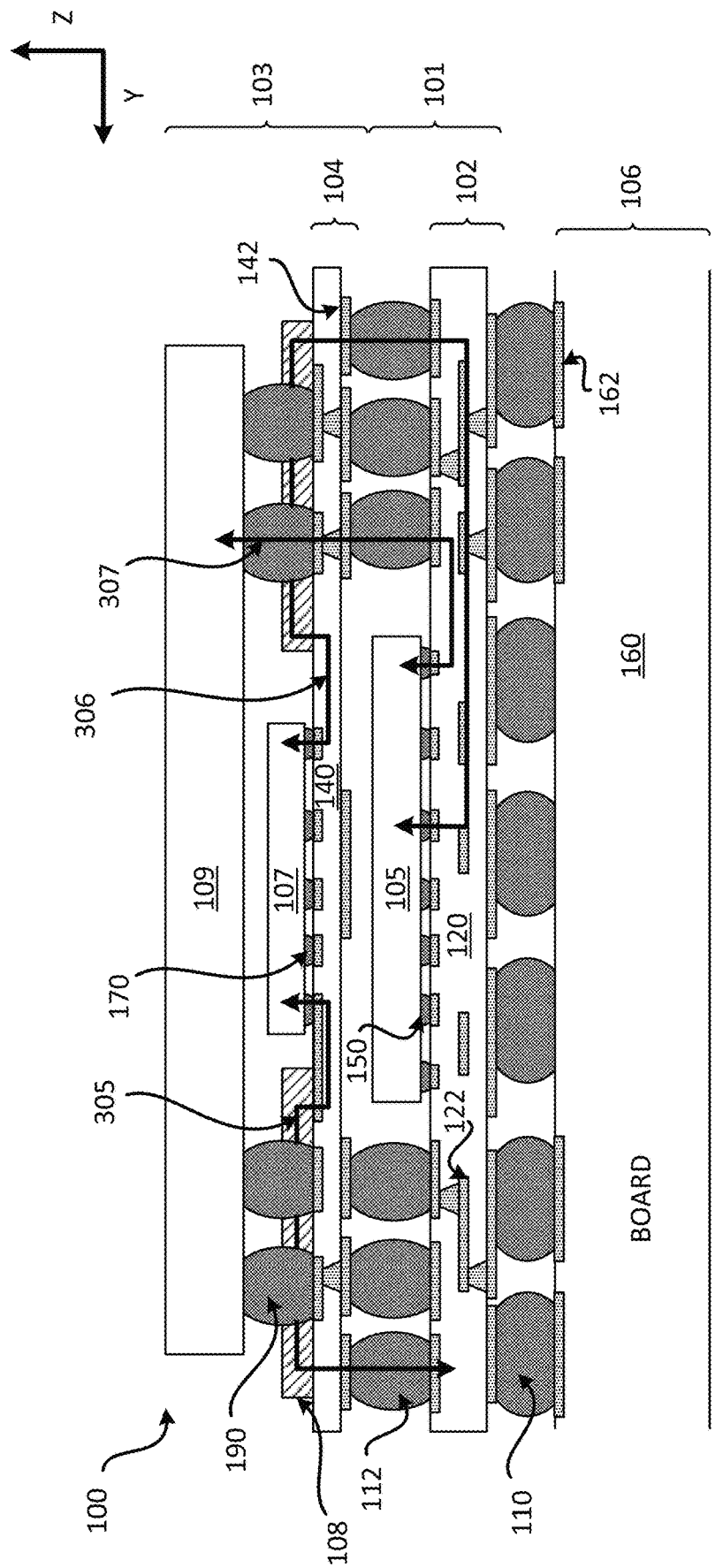
FIG. 3 illustrates exemplary electrical paths in a package that includes channel interconnections.

FIG. 3 illustrates possible electrical paths in the package 100. FIG. 3 illustrates an electrical path 305, an electrical path 306 and an electrical path 307. The electrical path 305 may represent a possible electrical path for one or more signals to and/or from the second integrated device 107. The electrical path 306 may represent a possible electrical path for one or more signals to and/or from the second integrated device 107. The electrical path 307 may represent a possible electrical path for one or more signals to and/or from the first integrated device 105.

The electrical path 305 (e.g., first electrical path, second electrical path, third electrical path) may be an example of an electrical path for one or more signals between the second integrated device 107 and the first substrate 102. The electrical path 305 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnections 108 (e.g., plurality of channel interconnects), (iv) at least one second interconnect from the second plurality of interconnects 142 of the second substrate 104, (v) at least one second solder interconnect from the first plurality of solder interconnects 112 coupling the second substrate 104 and the first substrate 102, and (vi) at least one interconnect from the first plurality of interconnects 122 of the first substrate 102. The at least one second solder interconnect from the first plurality of solder interconnects 112 that is part of the electrical path 305 may be solder interconnects 112 that are located along the periphery of the substrate 102, the substrate 104, and/or the package 100. In some implementations, solder interconnects 112 that are located along the periphery of the substrate 102 and/or the substrate 104 include solder interconnects that are closest to one or more edges of the substrate 102 and/or the substrate 104. In some implementations, solder interconnects 112 that are located along the periphery of the substrate 102 and/or the substrate 104 include rows of solder interconnects that are closest to one or more edges of the substrate 102 and/or the substrate 104. In some implementations, solder interconnects 112 that are located along the periphery of the substrate 102 and/or the substrate 104 may include the two rows of solder interconnects that are closest to one or more edges of the substrate 102 and/or the substrate 104. A row of solder interconnects may include rows along the X direction and/or along the Y direction of a substrate.

The electrical path 305 may be extended to be coupled to the board 106. For example, the electrical path 305 may also include at least one solder interconnect from the plurality of solder interconnects 110 and at least one board interconnect from the plurality of board interconnects 162. Thus, one or more signals between the board 106 and the second integrated device 107 may travel through the electrical path 305 as described above.

The electrical path 306 (e.g., first electrical path, second electrical path, third electrical path) may be an example of an electrical path for one or more signals between the second integrated device 107 and the first integrated device 105. The electrical path 306 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnections 108 (e.g., plurality of channel interconnects), (iv) at least one second interconnect from the second plurality of interconnects 142 of the second substrate 104, (v) at least one solder interconnect from the plurality of solder interconnects 112, at least one interconnect from the first plurality of interconnects 122, and (vi) at least one solder interconnect from the plurality of solder interconnects 150.

The electrical path 307 (e.g., first electrical path, second electrical path, third electrical path) may be an example of an electrical path for one or more signals between the first integrated device 105 and the third integrated device 109. The electrical path 307 may include (i) at least one solder interconnect (e.g., 150) coupling the first integrated device 105 to the first substrate 102, (ii) at least one first interconnect from the first plurality of interconnects 122 of the first substrate 102, (iii) at least one solder interconnect from the plurality of solder interconnects 112 coupling the second substrate 104 and the first substrate 102, (iv) at least one interconnect from the second plurality of interconnects 142 of the second substrate 104, and (v) at least one solder interconnect from the plurality of solder interconnects 190 coupling the third integrated device 109 and the second substrate 104.

FIG. 3 illustrates how electrical paths may be implemented and configured in the package to go in and out of channel interconnections to help reduce routing congestion, improve signal isolation and untangle routing to help provide improvement in package performance. In one example, the integrated device 105 may include an application processor, the integrated device 107 may include a modem, and the integrated device 109 may include memory. In some implementations, the substrate 104 may include two metal layers (e.g., M1, M2). In some implementations, the integrated device 107 may include one or more cores and/or one or more functions. In some implementations, different channel interconnects may be configured to be coupled to different cores and/or different functions of the integrated device 107. In some implementations, the plurality of channel interconnections 108 is configured to be used for signals, current and/or ground that travel to, from and/or through the integrated device 107.

Figure 4:
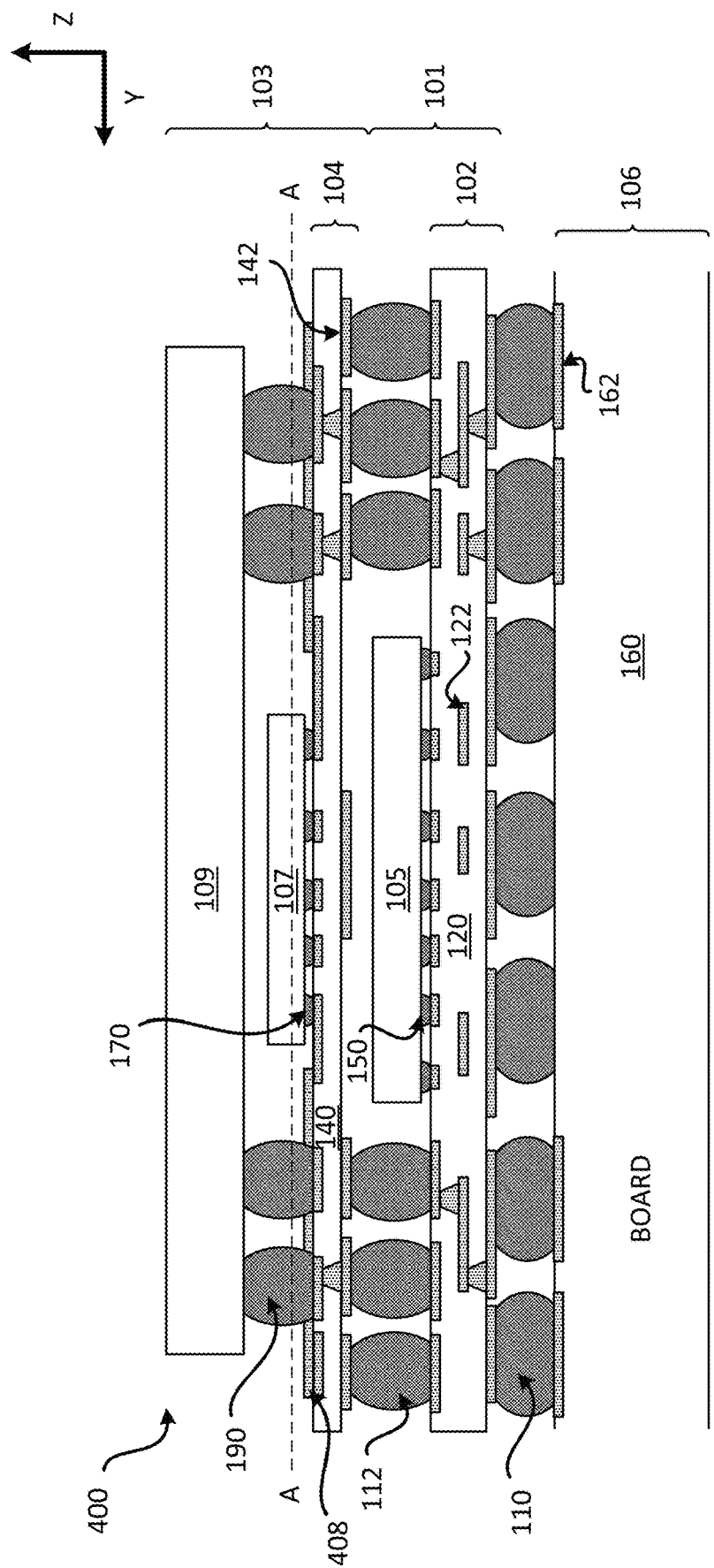
FIG. 4 illustrates an exemplary cross sectional profile view of a package that includes channel interconnects.

FIG. 4 illustrates a cross sectional profile view of a package 400 that includes channel interconnects. The package 400 may be a package on package (PoP). The package 400 may be similar to the package 100, and include similar components as the package 100. The package 400 may include the first package 101 and the second package 103. The package 400 is coupled to the board 106 through the plurality of solder interconnects 110. The package 400 includes the plurality of channel interconnects 408. The plurality of channel interconnects 408 may be an example of the plurality of channel interconnections 108. The plurality of channel interconnects 408 may be formed and/or located over the second substrate 104. The plurality of channel interconnects 408 may be coupled to the second plurality of interconnects 142. The plurality of channel interconnects 408 may be an example of a means for channel interconnection. The plurality of channel interconnects 408 may be printed (e.g., inkjet printed) over the second substrate 104. The plurality of channel interconnects 408 includes one metal layer. However, in some implementations, the plurality of channel interconnects 408 may include two or more metal layers. When there is more than one metal layer for the plurality of channel interconnects 408, a dielectric layer may be formed and located over a first metal layer of the plurality of channel interconnects 408, and a second metal layer may be formed over the dielectric layer and the first metal layer. The plurality of channel interconnects 408 may be defined by channel interconnects on the first metal layer and the second metal layer. In this example, the plurality of channel interconnects 408 on the first metal layer and the second metal layer, above the substrate 104, may be located (e.g., located laterally) between adjacent solder interconnects from the plurality of solder interconnects 190. In some implementations, at least one dielectric layer (not shown) may be located over the plurality of interconnects 408. The at least one dielectric layer may include a polymer (e.g., pure polymer). In some implementations, the dielectric layer that is located over the plurality of interconnects 408 is different than the at least one dielectric layer 140 of the second substrate 104.

The electrical path 305, the electrical path 306 and/or the electrical path 307 as described in FIG. 3, may be implemented in the package 400. For example, the electrical path 305 implemented in the package 400 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnects 408, (iv) at least one second interconnect from the second plurality of interconnects 142 of the second substrate 104, (v) at least one second solder interconnect from the first plurality of solder interconnects 112 coupling the second substrate 104 and the first substrate 102, and (vi) at least one interconnect from the first plurality of interconnects 122 of the first substrate 102. The electrical path 305 may be extended to be coupled to the board 106. For example, the electrical path 305 may also include at least one solder interconnect from the plurality of solder interconnects 110 and at least one board interconnect from the plurality of board interconnects 162. Thus, one or more signals between the board 106 and the second integrated device 107 may travel through the electrical path 305 as described above. The electrical path 305 may extend vertically through the substrate 102 and/or the substrate 104 in the periphery portion(s) of the substrate 102 and/or the substrate 104. For example, the electrical path 305 may include interconnects (e.g., via interconnects) that are located in the periphery portion(s) of the substrate 102 and/or the substrate 104.

The electrical path 306 implemented in the package 400 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnects 408, (iv) at least one second interconnect from the second plurality of interconnects 142 of the second substrate 104, (v) at least one solder interconnect from the plurality of solder interconnects 112, at least one interconnect from the first plurality of interconnects 122, and (vi) at least one solder interconnect from the plurality of solder interconnects 150.

The electrical path 307 implemented in the package 400 may include (i) at least one solder interconnect (e.g., 150) coupling the first integrated device 105 to the first substrate 102, (ii) at least one first interconnect from the first plurality of interconnects 122 of the first substrate 102, (iii) at least one solder interconnect from the plurality of solder interconnects 112 coupling the second substrate 104 and the first substrate 102, (iv) at least one interconnect from the second plurality of interconnects 142 of the second substrate 104, and (v) at least one solder interconnect from the plurality of solder interconnects 190 coupling the third integrated device 109 and the second substrate 104. The electrical path 307 may extend vertically through the substrate 102 and/or the substrate 104 in the periphery portion(s) of the substrate 102 and/or the substrate 104. For example, the electrical path 307 may include interconnects (e.g., via interconnects) that are located in the periphery portion(s) of the substrate 102 and/or the substrate 104. The periphery of a substrate (e.g., 102, 104) may be defined differently. In some implementations, the periphery portion of a substrate may include one or more portions of the substrate (e.g., including interconnects) between the edge(s) (e.g., first edge, second edge, third edge, fourth edge) of the substrate and an inner portion of the substrate that is located above or below the outer most row(s) of solder interconnects relative to a center of the substrate. A row of solder interconnects may be located along the X direction and/or along the Y direction. For example, a periphery of the substrate 102 may include one or more portions of the substrate 102 between the edge(s) of the substrate 102 and an inner portion located above or below the outer most row of solder interconnects 112 (e.g., row(s) of solder interconnects closest to edge(s) of substrate, row closest to first edge, row closest to second edge, row closest to third edge, row closest to fourth edge). A periphery of the substrate 104 may include one or more portions of the substrate 104 between the edge(s) of the substrate 104 and an inner portion located above or below the outer most row of solder interconnects 112 (e.g., row(s) of solder interconnects closest to edge(s) of substrate, row closest to first edge, row closest to second edge, row closest to third edge, row closest to fourth edge). In some implementations, a periphery portion of a substrate may include one or more portions of the substrate between the edge(s) of the substrate and an inner portion located above or below the two outer most rows of solder interconnects 112 (e.g., two rows of solder interconnects closest to edge(s) of substrate).

Figure 5:
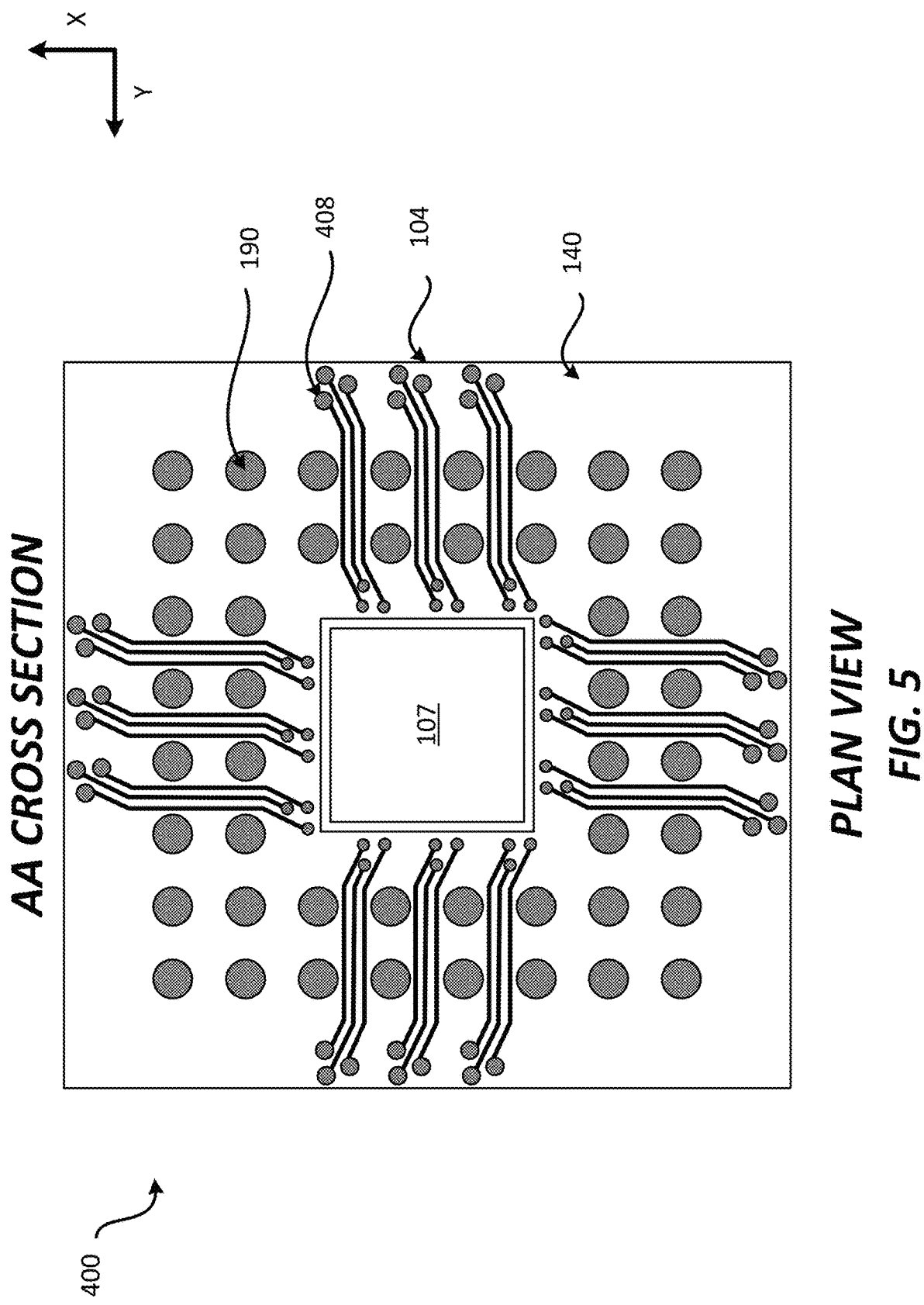
FIG. 5 illustrates an exemplary cross sectional plan view of a package that includes channel interconnects.

FIG. 5 illustrates a plan view across an AA cross section of the package 400. FIG. 5 illustrates the second substrate 104, the second integrated device 107, the plurality of solder interconnects 190, and the plurality of channel interconnects 408. As shown in FIG. 5, at least one channel interconnect from the plurality of channel interconnects 408 is located between adjacent solder interconnects from the plurality of solder interconnects 190. The plurality of channel interconnects 408 is located over the second substrate 104. The plurality of channel interconnects 408 may extend underneath the third integrated device 109. The plurality of channel interconnects 408 may include channel traces and/or channel pads. The plurality of channel interconnects 408 faces each of the four sides of the integrated device 107. For example, a first plurality of channel interconnects faces a first side of the integrated device 107, a second plurality of channel interconnects faces a second side of the integrated device 107, a third plurality of channel interconnects faces a third side of the integrated device 107, and a fourth plurality of channel interconnects faces a fourth side of the integrated device 107. However, it noted that the plurality of channel interconnects may face less than all four sides of the integrated device 107 (e.g., face one or more sides of the integrated device). The plurality of channel interconnects 408 may laterally surround the second integrated device 107. The plurality of channel interconnects 408 may include one or more metal layers (e.g., one metal layer, two metal layers) to accommodate various interconnections needs and/ or designs. The plurality of solder interconnects 190 may laterally surround the second integrated device 107.

Figure 6:
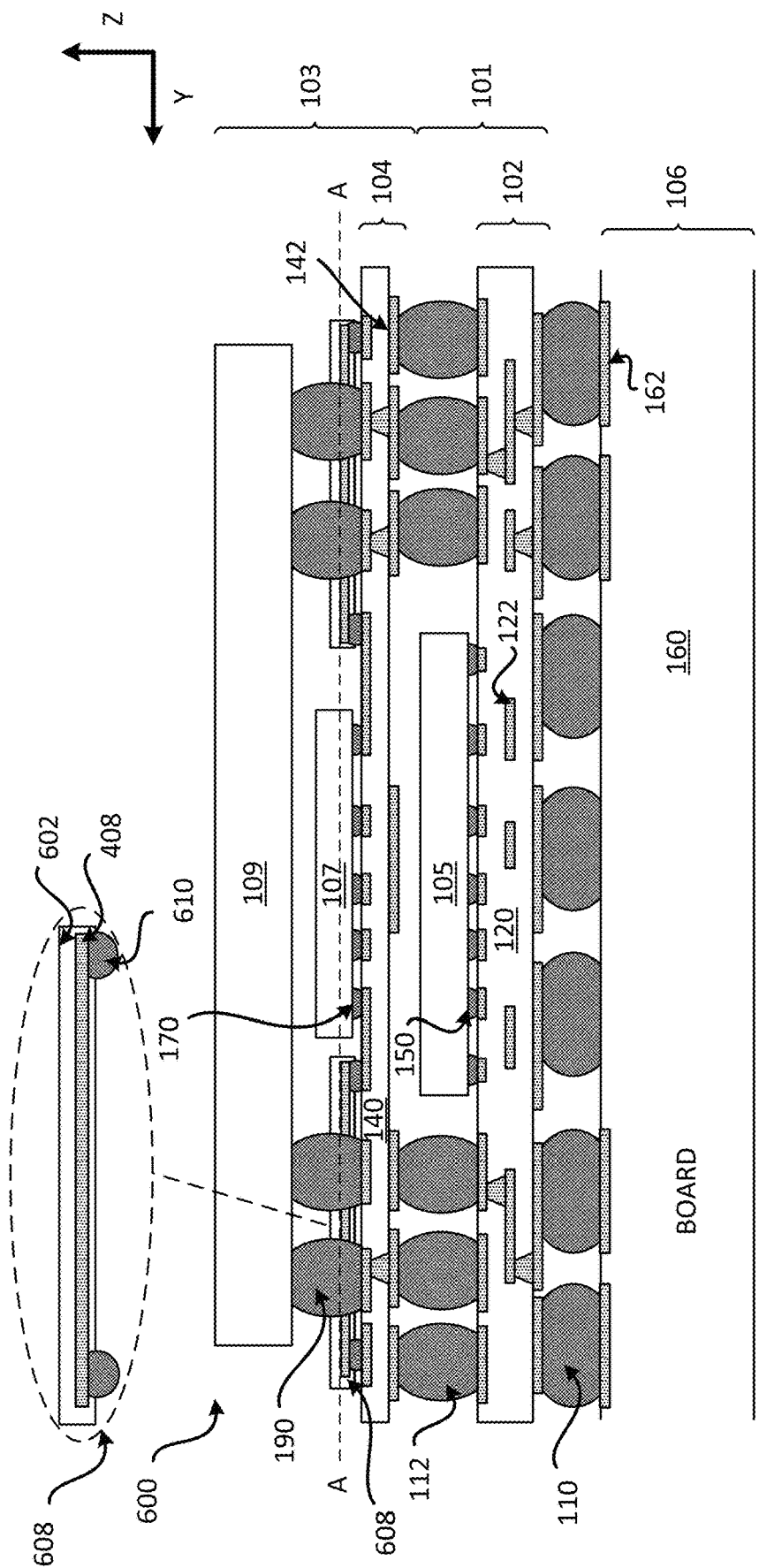
FIG. 6 illustrates an exemplary cross sectional profile view of a package that includes a channel substrate with channel interconnects.

FIG. 6 illustrates a cross sectional profile view of a package 600 that includes channel interconnects. The package 600 may be a package on package (PoP). The package 600 may be similar to the package 100, and include similar components as the package 100. The package 600 may include the first package 101 and the second package 103. The package 600 is coupled to the board 106 through the plurality of solder interconnects 110. The package 600 includes a plurality of channel substrates 608 (e.g., fourth substrate, patch substrate). The plurality of channel substrates 608 may include at least one channel dielectric layer 602 and the plurality of channel interconnects 408. The plurality of channel substrates 608 may include different numbers of metal layers. The plurality of channel substrates 608 may be an example of the plurality of channel interconnections 108. The plurality of channel substrates 608 may be provided over the second substrate 104. The plurality of channel substrates 608 may be coupled to the second plurality of interconnects 142 through a plurality of solder interconnects 610. For example, the plurality of channel interconnects 408 may be coupled to the second plurality of interconnects 142 through the plurality of solder interconnects 610. The plurality of channel substrates 608 may be an example of a means for channel interconnection. FIG. 6 illustrates the plurality of channel substrates 608 being coupled to the second substrate 104 through the plurality of solder interconnects 610 (e.g., ball grid array (BGA)). However, in some implementations, the plurality of channel substrates 608 may be coupled to the second substrate 104 through a land grid array (LGA). In some implementations, the plurality of channel interconnects 408 of the plurality of channel substrates 608 may be coupled to the second plurality of interconnects 142 without the need of solder interconnects. FIG. 6 illustrates the plurality of channel substrates 608 that includes one metal layer. However, in some implementations, the plurality of channel substrates 608 may include a plurality of channel interconnects 408 on two or more metal layers.

The electrical path 305, the electrical path 306 and/or the electrical path 307 as described in FIG. 3, may be implemented in the package 600. For example, the electrical path 305 implemented in the package 600 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnects 408 from the plurality of channel substrates 608 (may also include solder interconnects (in and out) from the plurality of solder interconnects 610), (iv) at least one second interconnect from the second plurality of interconnects 142 of the second substrate 104, (v) at least one second solder interconnect from the first plurality of solder interconnects 112 coupling the second substrate 104 and the first substrate 102, and (vi) at least one interconnect from the first plurality of interconnects 122 of the first substrate 102. The electrical path 305 may be extended to be coupled to the board 106. For example, the electrical path 305 may also include at least one solder interconnect from the plurality of solder interconnects 110 and at least one board interconnect from the plurality of board interconnects 162. Thus, one or more signals between the board 106 and the second integrated device 107 may travel through the electrical path 305 as described above.

The electrical path 306 implemented in the package 600 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnects 408 from the plurality of channel substrates 608 (may also include solder interconnects (in and out) from the plurality of solder interconnects 610), (iv) at least one second interconnect from the second plurality of interconnects 142 of the second substrate 104, (v) at least one solder interconnect from the plurality of solder interconnects 112, at least one interconnect from the first plurality of interconnects 122, and (vi) at least one solder interconnect from the plurality of solder interconnects 150.

The electrical path 307 implemented in the package 600 may include (i) at least one solder interconnect (e.g., 150) coupling the first integrated device 105 to the first substrate 102, (ii) at least one first interconnect from the first plurality of interconnects 122 of the first substrate 102, (iii) at least one solder interconnect from the plurality of solder interconnects 112 coupling the second substrate 104 and the first substrate 102, (iv) at least one interconnect from the second plurality of interconnects 142 of the second substrate 104, and (v) at least one solder interconnect from the plurality of solder interconnects 190 coupling the third integrated device 109 and the second substrate 104.

Figure 7:
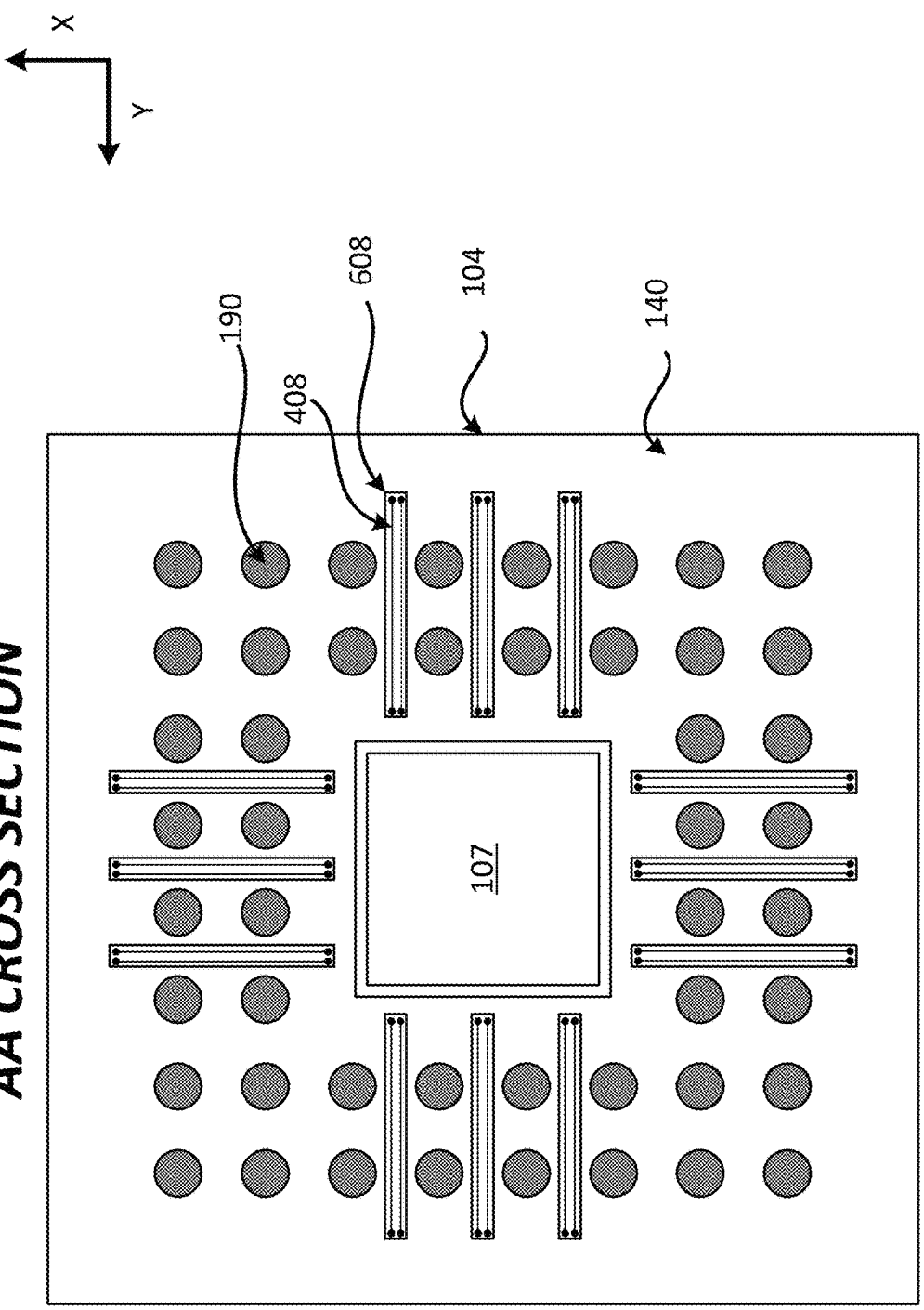
FIG. 7 illustrates an exemplary cross sectional plan view of a package that includes a channel substrate with channel interconnects.

FIG. 7 illustrates a plan view across an AA cross section of the package 600. FIG. 7 illustrates the second substrate 104, the second integrated device 107, the plurality of solder interconnects 190, and the plurality of channel substrates 608. As shown in FIG. 7, at least some of the plurality of channel interconnects 408 from the plurality of channel substrates 608 are located between adjacent solder interconnects from the plurality of solder interconnects 190. The plurality of channel interconnects 408 from the plurality of channel substrates 608 and the plurality of channel substrates 608 are located over the second substrate 104. The plurality of channel interconnects 408 may extend underneath the third integrated device 109. The plurality of channel interconnects 408 may include channel traces and/or channel pads. The plurality of channel substrates 608 faces each of the four sides of the integrated device 107. For example, a first plurality of channel substrates faces a first side of the integrated device 107, a second plurality of channel substrates faces a second side of the integrated device 107, a third plurality of channel substrates faces a third side of the integrated device 107, and a fourth plurality of channel substrates faces a fourth side of the integrated device 107. However, it noted that the plurality of channel substrates may face less than all four sides of the integrated device 107 (e.g., face one or more sides of the integrated device). The plurality of channel interconnects 408 faces each of the four sides of the integrated device 107. For example, a first plurality of channel interconnects faces a first side of the integrated device 107, a second plurality of channel interconnects faces a second side of the integrated device 107, a third plurality of channel interconnects faces a third side of the integrated device 107, and a fourth plurality of channel interconnects faces a fourth side of the integrated device 107. However, it noted that the plurality of channel interconnects may face less than all four sides of the integrated device 107 (e.g., face one or more sides of the integrated device). The plurality of channel substrates 608 may laterally surround the second integrated device 107. The plurality of channel substrates 608 may include one or more metal layers (e.g., one metal layer, two metal layers) to accommodate various interconnections needs and/or designs. The plurality of solder interconnects 190 may laterally surround the second integrated device 107.

Figure 8:
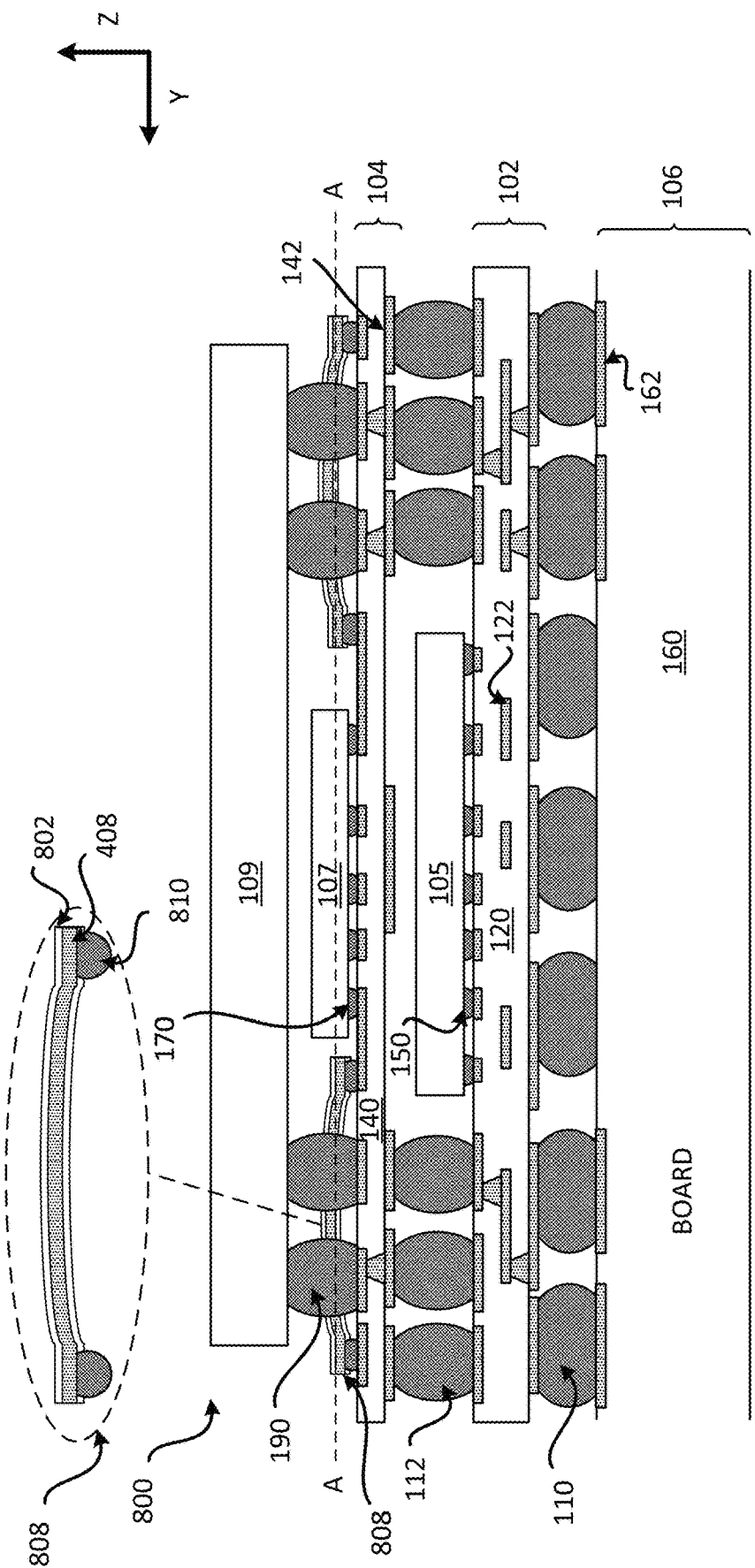
FIG. 8 illustrates an exemplary cross sectional profile view of a package that includes a flexible cable with channel interconnects.

FIG. 8 illustrates a cross sectional profile view of a package 800 that includes channel interconnects. The package 800 may be a package on package (PoP). The package 800 may be similar to the package 100, and include similar components as the package 100. The package 800 may include the first package 101 and the second package 103. The package 800 is coupled to the board 106 through the plurality of solder interconnects 110. The package 800 includes a plurality of flexible cables 808 (e.g., flexible substrate, flexible board, flexible printed circuit board). The plurality of flexible cables 808 may include at least one flexible dielectric layer 802 and the plurality of channel interconnects 408. The at least one flexible dielectric layer 802 may include polyimide. The plurality of flexible cables 808 may include different numbers of metal layers. The plurality of flexible cables 808 may be an example of the plurality of channel interconnections 108. The plurality of flexible cables 808 may be provided over the second substrate 104. The plurality of flexible cables 808 may be coupled to the second plurality of interconnects 142 through a plurality of solder interconnects 810. For example, the plurality of channel interconnects 408 may be coupled to the second plurality of interconnects 142 through the plurality of solder interconnects 810. The plurality of flexible cables 808 may be an example of a means for channel interconnection. FIG. 8 illustrates the plurality of flexible cables 808 that includes one metal layer. However, in some implementations, the plurality of flexible cables 808 may include a plurality of channel interconnects 408 on two or more metal layers.

The electrical path 305, the electrical path 306 and/or the electrical path 307 as described in FIG. 3, may be implemented in the package 800. For example, the electrical path 305 implemented in the package 800 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnects 408 from the plurality of flexible cables 808 (may also include solder interconnects (in and out) from the plurality of solder interconnects 810), (iv) at least one second interconnect from the second plurality of interconnects 142 of the second substrate 104, (v) at least one second solder interconnect from the first plurality of solder interconnects 112 coupling the second substrate 104 and the first substrate 102, and (vi) at least one interconnect from the first plurality of interconnects 122 of the first substrate 102. The electrical path 305 may be extended to be coupled to the board 106. For example, the electrical path 305 may also include at least one solder interconnect from the plurality of solder interconnects 110 and at least one board interconnect from the plurality of board interconnects 162. Thus, one or more signals between the board 106 and the second integrated device 107 may travel through the electrical path 305 as described above.

The electrical path 306 implemented in the package 800 may include (i) at least one solder interconnect (e.g., 170) coupling the second integrated device 107 to the second substrate 104, (ii) at least one first interconnect from the second plurality of interconnects 142 of the second substrate 104, (iii) at least one channel interconnect from the plurality of channel interconnects 408 from the plurality of flexible cables 808 (may also include solder interconnects (in and out) from the plurality of solder interconnects 810), (iv) at least one second interconnect from the second plurality of interconnects 142 of the second substrate 104, (v) at least one solder interconnect from the plurality of solder interconnects 112, at least one interconnect from the first plurality of interconnects 122, and (vi) at least one solder interconnect from the plurality of solder interconnects 150.

The electrical path 307 implemented in the package 800 may include (i) at least one solder interconnect (e.g., 150) coupling the first integrated device 105 to the first substrate 102, (ii) at least one first interconnect from the first plurality of interconnects 122 of the first substrate 102, (iii) at least one solder interconnect from the plurality of solder interconnects 112 coupling the second substrate 104 and the first substrate 102, (iv) at least one interconnect from the second plurality of interconnects 142 of the second substrate 104, and (v) at least one solder interconnect from the plurality of solder interconnects 190 coupling the third integrated device 109 and the second substrate 104.

Figure 9:
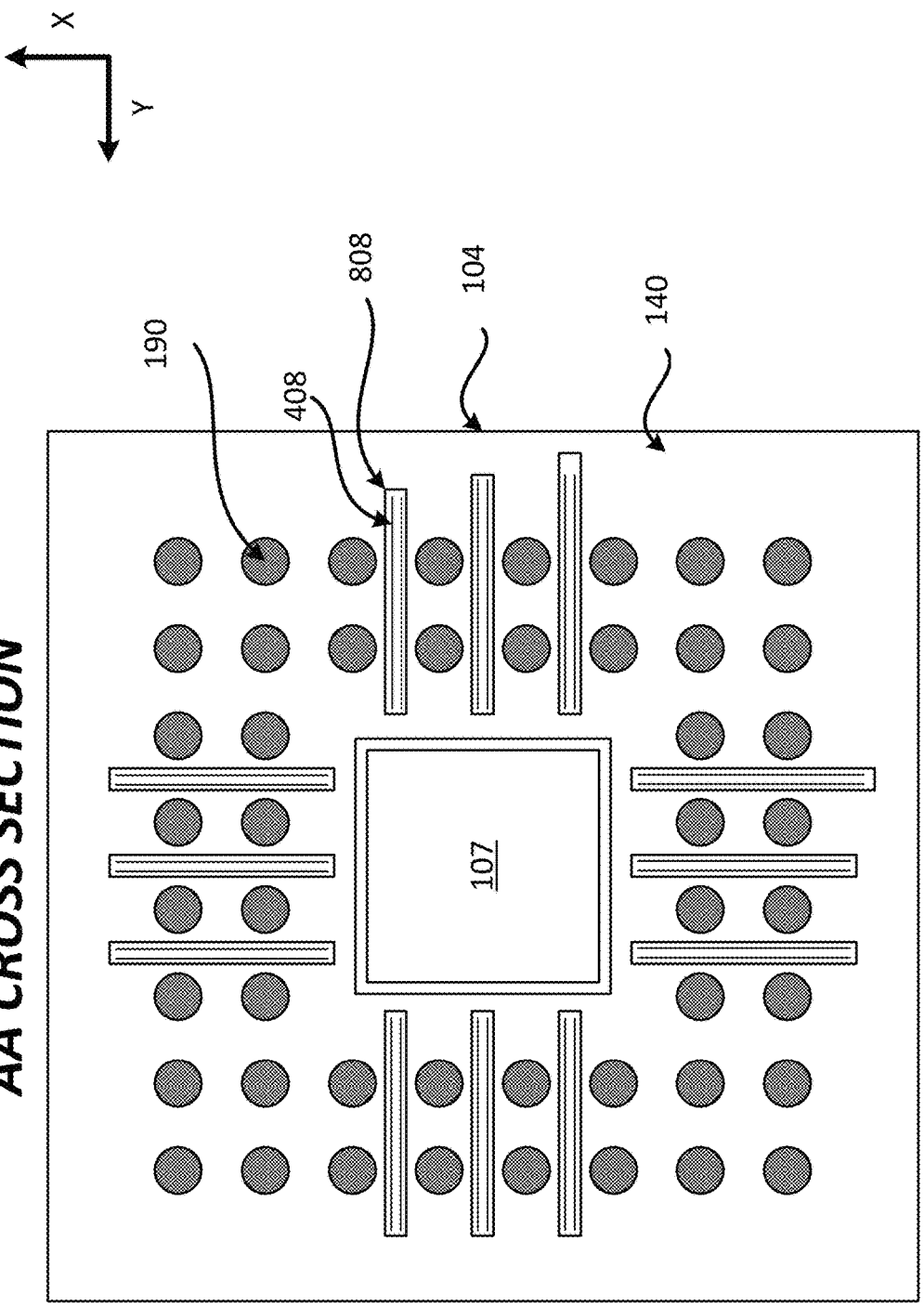
FIG. 9 illustrates an exemplary cross sectional plan view of a package that includes a flexible cable with channel interconnects.

FIG. 9 illustrates a plan view across an AA cross section of the package 800. FIG. 9 illustrates the second substrate 104, the second integrated device 107, the plurality of solder interconnects 190, and the plurality of flexible cables 808. As shown in FIG. 9, at least some of the plurality of channel interconnects 408 from the plurality of flexible cables 808 are located between adjacent solder interconnects from the plurality of solder interconnects 190. The plurality of channel interconnects 408 from the plurality of flexible cables 808 and the plurality of flexible cables 808 are located over the second substrate 104. The plurality of channel interconnects 408 may extend underneath the third integrated device 109. The plurality of channel interconnects 408 may include channel traces and/or channel pads. The plurality of flexible cables 808 faces each of the four sides of the integrated device 107. For example, a first plurality of flexible cables faces a first side of the integrated device 107, a second plurality of flexible cables faces a second side of the integrated device 107, a third plurality of flexible cables faces a third side of the integrated device 107, and a fourth plurality of flexible cables faces a fourth side of the integrated device 107. However, it noted that the plurality of flexible cables may face less than all four sides of the integrated device 107 (e.g., face one or more sides of the integrated device). The plurality of channel interconnects 408 faces each of the four sides of the integrated device 107. For example, a first plurality of channel interconnects faces a first side of the integrated device 107, a second plurality of channel interconnects faces a second side of the integrated device 107, a third plurality of channel interconnects faces a third side of the integrated device 107, and a fourth plurality of channel interconnects faces a fourth side of the integrated device 107. However, it noted that the plurality of channel interconnects may face less than all four sides of the integrated device 107 (e.g., face one or more sides of the integrated device). The plurality of flexible cables 808 may laterally surround the second integrated device 107. The plurality of flexible cables 808 may include one or more metal layers (e.g., one metal layer, two metal layers) to accommodate various interconnections needs and/or designs. The plurality of solder interconnects 190 may laterally surround the second integrated device 107.

Figure 10:
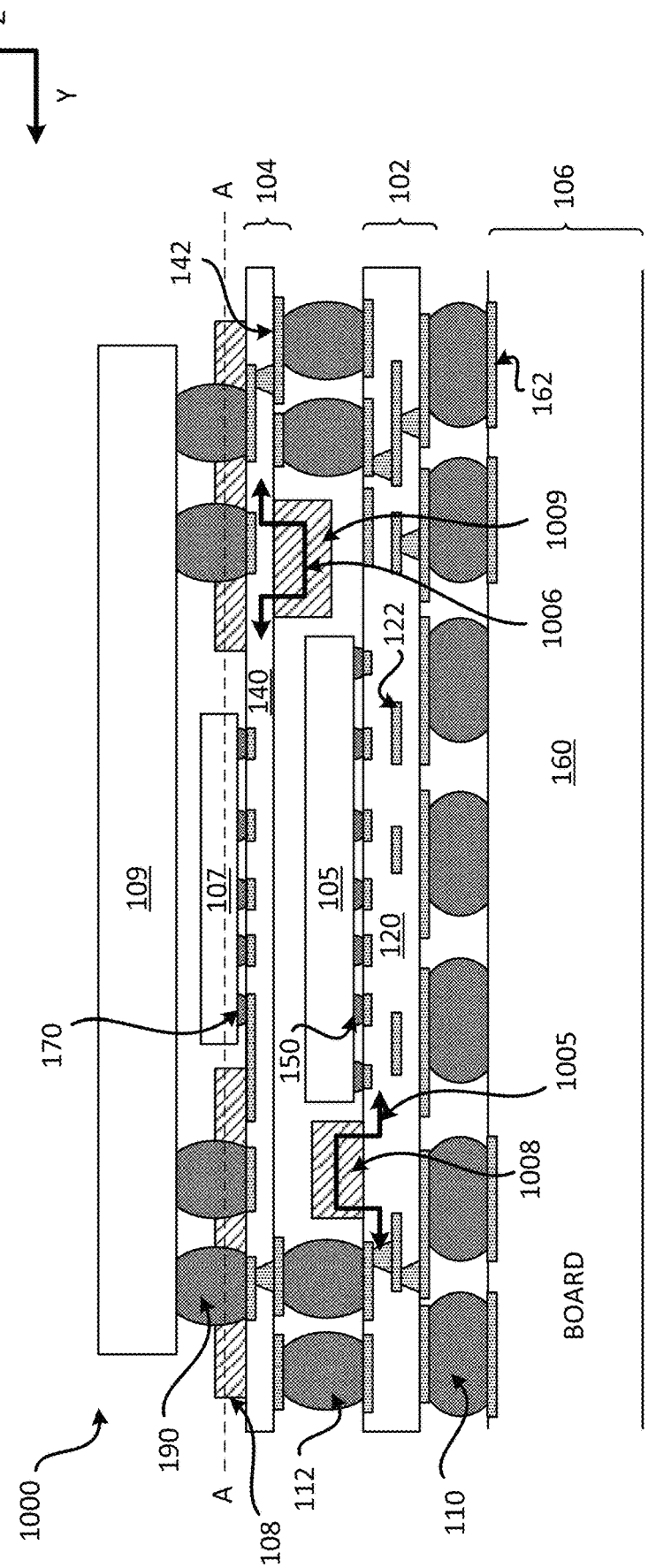
FIG. 10 illustrates an exemplary cross sectional profile view of a package that includes several channel interconnections.

FIG. 10 illustrates a cross sectional profile view of a package 1000 that includes channel interconnects. The package 1000 may be a package on package (PoP). The package 1000 may be similar to the package 100, and include similar components as the package 100. The package 1000 may include the first package 101 and the second package 103.

The package 1000 is coupled to the board 106 through the plurality of solder interconnects 110.

The package 1000 includes the plurality of channel interconnections 108, a plurality of channel interconnections 1008 and a plurality of channel interconnections 1009. The plurality of channel interconnections 1008 may implemented as the plurality of channel interconnects 408, the plurality of channel substrates 608 and/or the plurality of flexible cables 808, as described in FIGS. 4-9. Similarly, the plurality of channel interconnections 1009 may be implemented as the plurality of channel interconnects 408, the plurality of channel substrates 608 and/or the plurality of flexible cables 808, as described in FIGS. 4-9. The plurality of channel interconnections 1008 is coupled to the first surface (e.g., top surface) of the first substrate 102. The plurality of channel interconnections 1009 is coupled to the second surface (e.g., bottom surface) of the second substrate 104.

An electrical path 1005 (e.g., first electrical path, second electrical path) may include the plurality of channel interconnections 1008 (e.g., plurality of channel interconnects 408). For example, at least one signal traveling through the electrical path 1005 may enter and exit the plurality of channel interconnections 1008 (e.g., plurality of channel interconnects 408) through the first plurality of interconnects 122 of the first substrate 102 (e.g., enter and exit through the first surface of the first substrate 102). In some implementations, the electrical path 1005 may be implemented with the electrical path 305, the electrical path 306 and/or the electrical path 307. The electrical path 1005 may be part of an electrical path (e.g., 305, 306, 307) that is coupled to the first integrated device 105, the second integrated device 107, and/or the third integrated device 109.

An electrical path 1006 (e.g., first electrical path, second electrical path) may include the plurality of channel interconnections 1009 (e.g., plurality of channel interconnects 408). For example, at least one signal traveling through the electrical path 1006 may enter and exit the plurality of channel interconnections 1009 (e.g., plurality of channel interconnects 408) through the second plurality of interconnects 142 of the second substrate 104 (e.g., enter and exit through the second surface of the second substrate 104). In some implementations, the electrical path 1005 may be implemented with the electrical path 305, the electrical path 306 and/or the electrical path 307. The electrical path 1006 may be part of an electrical path (e.g., 305, 306, 307) that is coupled to the first integrated device 105, the second integrated device 107, and/or the third integrated device 109.

The plurality of channel interconnections (e.g., 108, 1006, 1008), as described in the disclosure may be implemented as part of package that includes one substrate, two substrates, or more than two substrates. A substrate may include one or more channel interconnections, over one surface (e.g., top surface, bottom surface) or both surfaces of the substrate. In some implementations, a package may include different designs and/or variations of the plurality of channel interconnections. For example, a combination of the substrate and the flexible cable may be used with a substrate. The plurality of channel interconnections may have different sizes and/or shapes. The plurality of channel interconnections may have different numbers of channel interconnects.

An integrated device (e.g., 105, 107, 109) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 105, 107, 109) may include at least one electronic circuit (e.g., first electronic circuit, second electronic circuit, etc. . . . ). An integrated device may include transistors. An integrated device may be an example of an electrical component and/or electrical device.

The package (e.g., 100, 400, 600, 800) may be implemented in a radio frequency (RF) package. The RF package may be a radio frequency front end (RFFE) package. A package (e.g., 100, 400, 600, 800) may be configured to provide Wireless Fidelity (WiFi) communication and/or cellular communication (e.g., 2G, 3G, 4G, 5G). The packages (e.g., 100, 400, 600, 800) may be configured to support Global System for Mobile (GSM) Communications, Universal Mobile Telecommunications System (UMTS), and/or Long-Term Evolution (LTE). The packages (e.g., 100, 400) may be configured to transmit and receive signals having different frequencies and/or communication protocols.

Having described various packages, a sequence for fabricating a package will now be described below.

Exemplary Sequence for Fabricating a Package Comprising Channel Interconnects

Figure 11A:
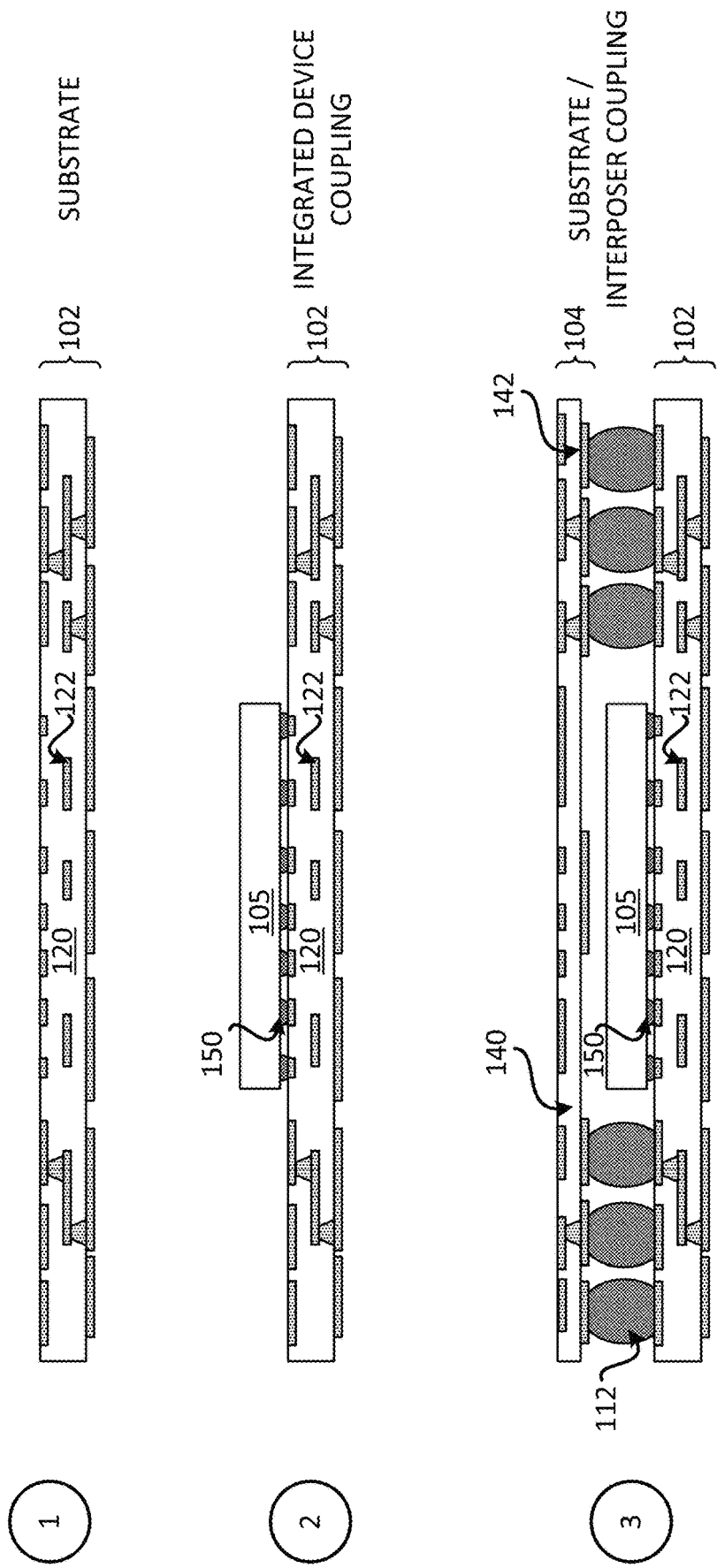
FIGS. 11A-11C illustrate an exemplary sequence for fabricating a package comprising a plurality of channel interconnects.
Figure 11B:
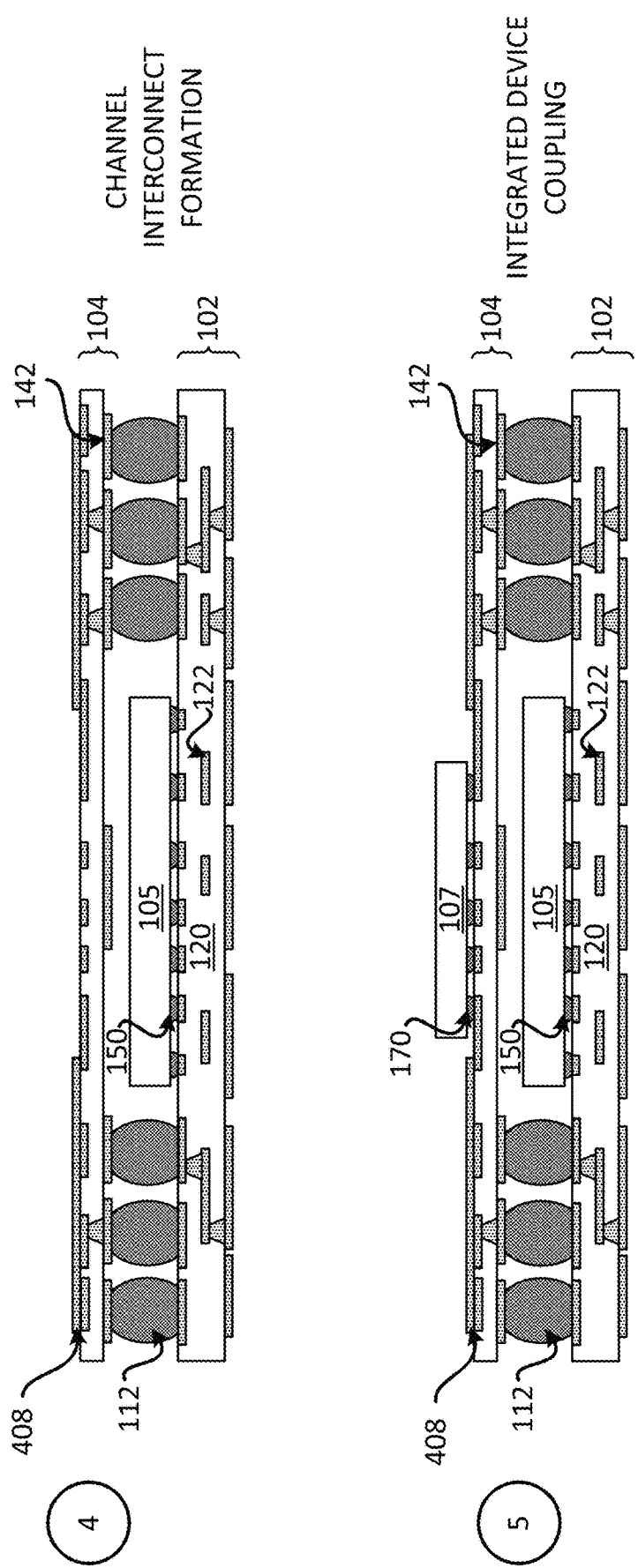
Figure 11C:
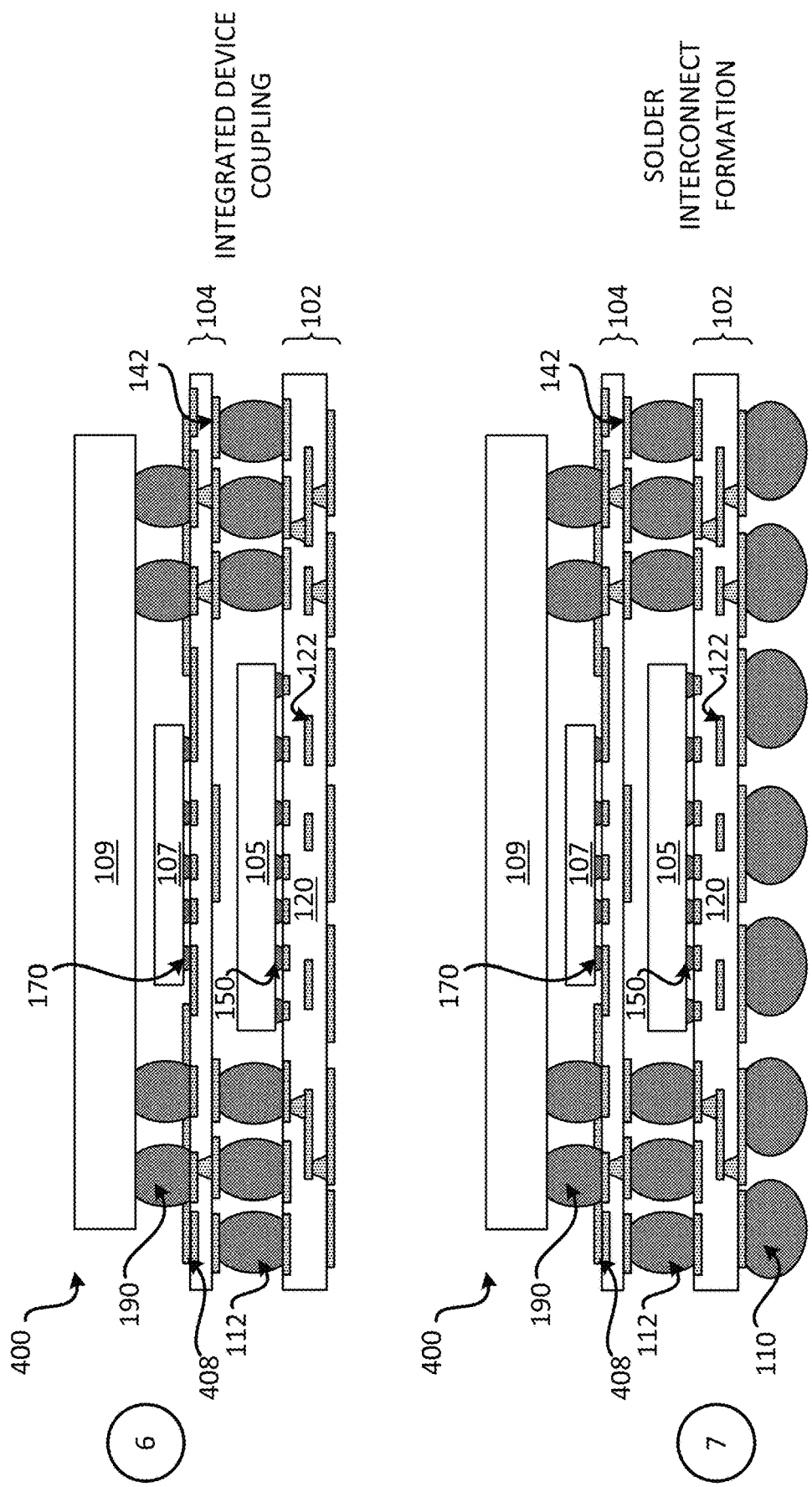

In some implementations, fabricating a package includes several processes. FIGS. 11A-11C illustrate an exemplary sequence for providing or fabricating a package that includes channel interconnects. In some implementations, the sequence of FIGS. 11A-11C may be used to provide or fabricate the package 400. However, the process of FIGS. 11A-11C may be used to fabricate any of the packages (e.g., 100, 1000) described in the disclosure.

It should be noted that the sequence of FIGS. 11A-11C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 11A, illustrates a state after a substrate 102 is provided. The substrate 102 includes at least one dielectric layer 120 and a plurality of interconnects 122. The substrate 102 may include a first surface (e.g., top surface) and a second surface (e.g., bottom surface). The substrate 102 may be fabricated using the method as described in FIGS. 14A-14B. In some implementations, a cored substrate is provided (e.g., substrate that includes a core layer).

Stage 2 illustrates a state after a first integrated device 105 is coupled to the first surface (e.g., top surface) of the substrate 102. The first integrated device 105 may be coupled to the substrate 102 through the plurality of solder interconnects 150. A solder reflow process may be used to couple the first integrated device 105 to the substrate 102.

Stage 3 illustrates a state after a substrate 104 is coupled to the substrate 102 through a plurality of solder interconnects 112. A solder reflow process may be used to couple the substrate 104 to the substrate 102. The substrate 104 is coupled to the substrate 102 such that the first integrated device 105 is located between the substrate 102 and the substrate 104. The substrate 104 includes at least one dielectric layer 140 and a plurality of interconnects 142. The substrate 104 may be fabricated using the method as described in FIGS. 14A-14B. The substrate 104 may be an interposer.

Stage 4, as shown in FIG. 11B, illustrates a state after the plurality of channel interconnects 408 is formed over the first surface of the second substrate 104. The plurality of channel interconnects 408 may be coupled to the second plurality of interconnects 142. The plurality of channel interconnects 408 may be printed (e.g., inkjet printed) over the second substrate 104. Additional metal layers of the plurality of channel interconnects 408 may be formed over the substrate 104. One or more dielectric layers may be formed over the plurality of channel interconnects 408.

Stage 5 illustrates a state after a second integrated device 107 is coupled to the first surface (e.g., top surface) of the substrate 104. The second integrated device 107 may be coupled to the substrate 104 through the plurality of solder interconnects 170. A solder reflow process may be used to couple the second integrated device 107 to the substrate 104.

Stage 6, as shown in FIG. 11C, illustrates a state after a third integrated device 109 is coupled to the first surface (e.g., top surface) of the substrate 104. The third integrated device 109 may be coupled to the substrate 104 through the plurality of solder interconnects 190. A solder reflow process may be used to couple the third integrated device 109 to the substrate 104. The third integrated device 109 may be located over the second integrated device 107. The second integrated device 107 may be located between the third integrated device 109 and the substrate 104. At least one channel interconnect from the plurality of channel interconnects 408 may be located between solder interconnects from the plurality of solder interconnects 190. The plurality of solder interconnects 190 may laterally surround the second integrated device 107.

Stage 7 illustrates a state after a plurality of solder interconnects 110 is coupled to the second surface of the substrate 102. A solder reflow process may be used to couple the plurality of solder interconnects 110 to the substrate 102. Stage 7 may illustrate the package 400 that includes the plurality of channel interconnects 408, as described at least in FIG. 4. The package 400 may be fabricated one at a time or may be fabricated together in part or as a whole as part of one or more strips or panels and then assembled or singulated into individual packages.

Exemplary Sequence for Fabricating a Package Comprising Channel Interconnects

Figure 12A:
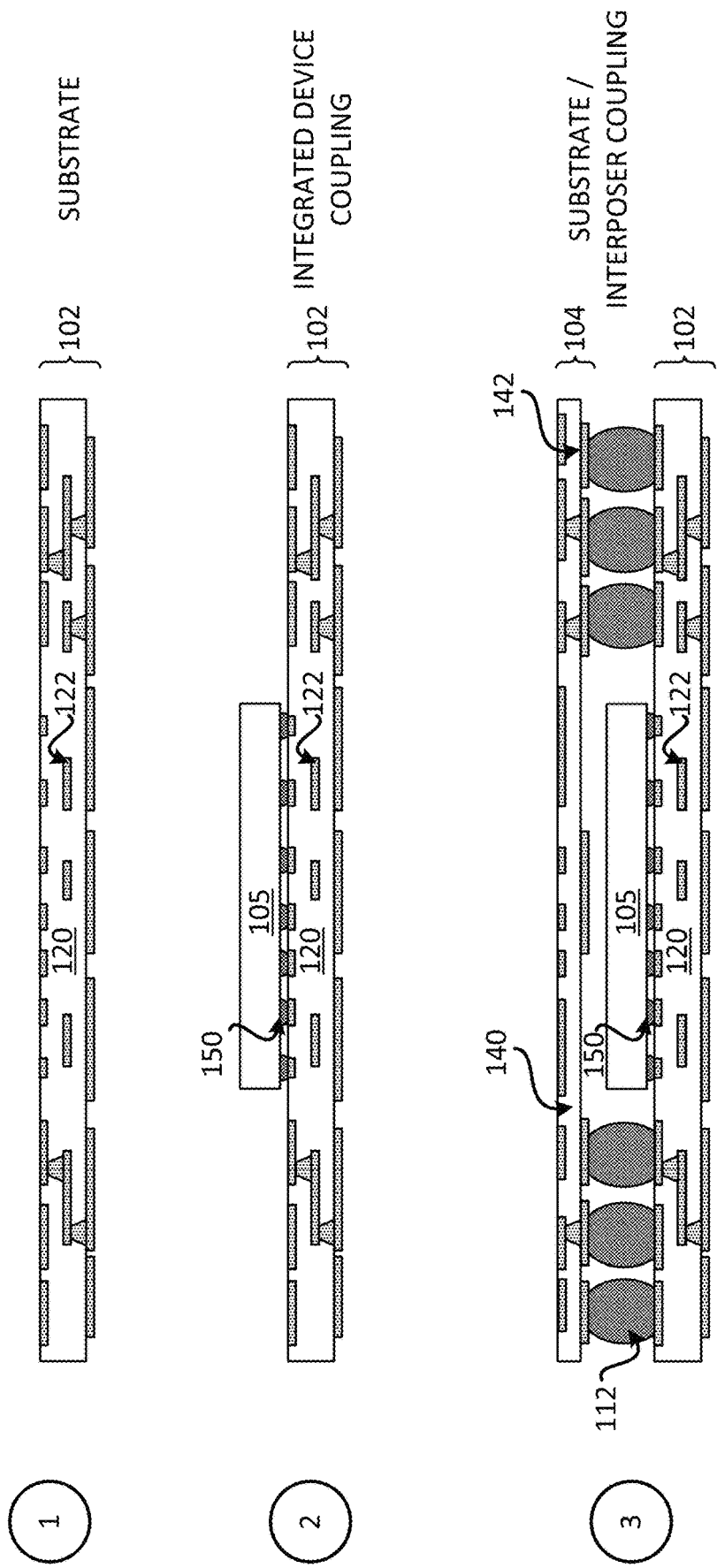
FIGS. 12A-12C illustrate an exemplary sequence for fabricating a package comprising a channel substrate that includes plurality of channel interconnects.
Figure 12B:
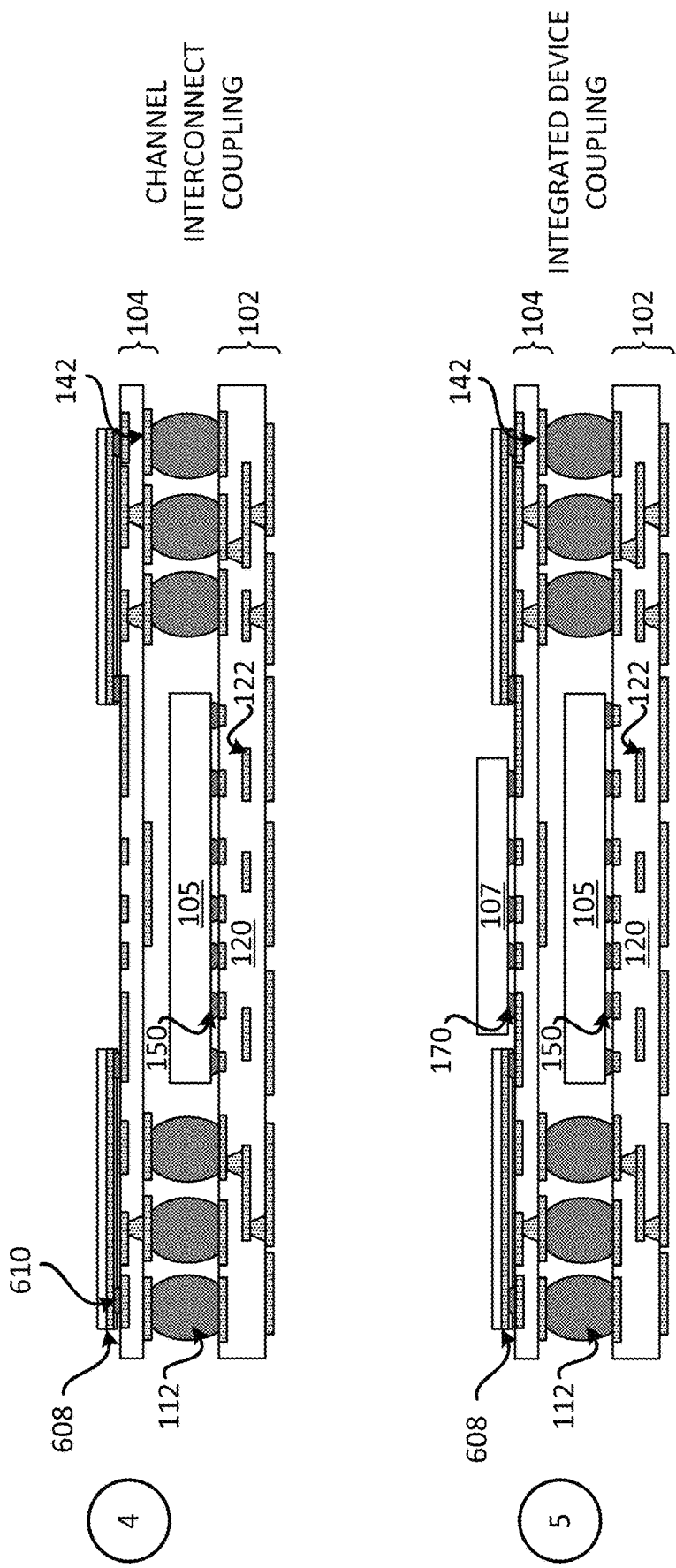
Figure 12C:
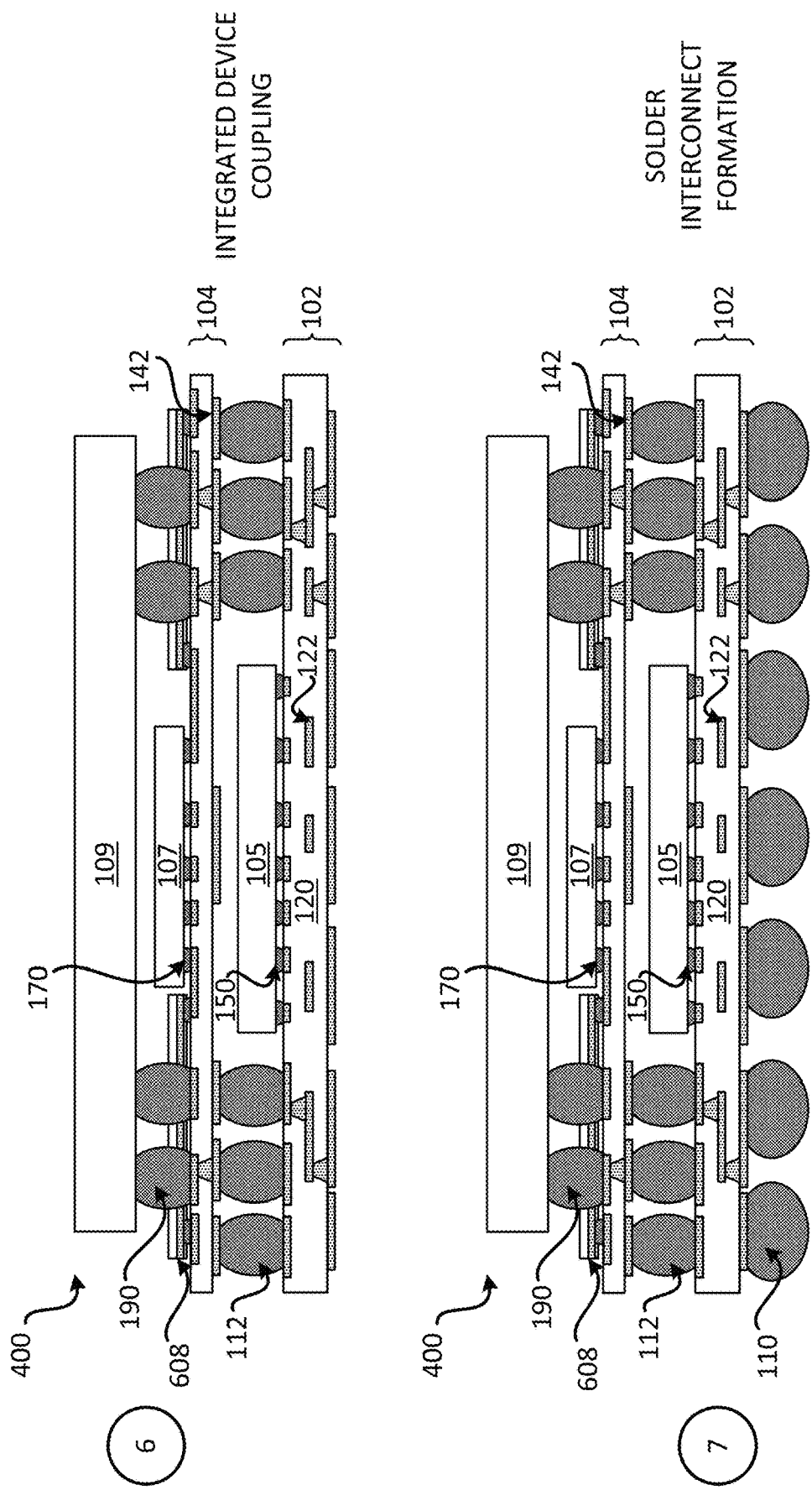

In some implementations, fabricating a package includes several processes. FIGS. 12A-12C illustrate an exemplary sequence for providing or fabricating a package that includes channel interconnects. In some implementations, the sequence of FIGS. 12A-12C may be used to provide or fabricate the package 600. However, the process of FIGS. 12A-12C may be used to fabricate any of the packages (e.g., 800, 1000) described in the disclosure.

It should be noted that the sequence of FIGS. 12A-12C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 12A, illustrates a state after a substrate 102 is provided. The substrate 102 includes at least one dielectric layer 120 and a plurality of interconnects 122. The substrate 102 may include a first surface (e.g., top surface) and a second surface (e.g., bottom surface). The substrate 102 may be fabricated using the method as described in FIGS. 14A-14B. In some implementations, a cored substrate is provided (e.g., substrate that includes a core layer).

Stage 2 illustrates a state after a first integrated device 105 is coupled to the first surface (e.g., top surface) of the substrate 102. The first integrated device 105 may be coupled to the substrate 102 through the plurality of solder interconnects 150. A solder reflow process may be used to couple the first integrated device 105 to the substrate 102.

Stage 3 illustrates a state after a substrate 104 is coupled to the substrate 102 through a plurality of solder interconnects 112. A solder reflow process may be used to couple the substrate 104 to the substrate 102. The substrate 104 is coupled to the substrate 102 such that the first integrated device 105 is located between the substrate 102 and the substrate 104. The substrate 104 includes at least one dielectric layer 140 and a plurality of interconnects 142. The substrate 104 may be fabricated using the method as described in FIGS. 14A-14B. The substrate 104 may be an interposer.

Stage 4, as shown in FIG. 12B, illustrates a state after the plurality of channel substrates 608 is coupled to the first surface of the second substrate 104. The plurality of channel substrates 608 may include the plurality of channel interconnects 408. The plurality of channel interconnects 408 may be coupled to the second plurality of interconnects 142 through a plurality of solder interconnects 610. In some implementations, the plurality of channel interconnects 408 from the plurality of channel substrates 608 may be coupled to the substrate 104 through land grid array (LGA).

In some implementations, instead of or in addition to the plurality of channel substrates 608, a plurality of flexible cables 808 may be coupled to the first surface of the second substrate 104. In some implementations, the plurality of channel substrates 608 and/or the plurality of flexible cables 808 may be coupled to a second surface of the second substrate 104 and/or a first surface of the substrate 102. The plurality of channel substrates 608 and/or the plurality of flexible cables 808 may be coupled to a second surface of the second substrate 104 and/or a first surface of the substrate 102, before the substrate 104 is coupled to the substrate 102.

Stage 5 illustrates a state after a second integrated device 107 is coupled to the first surface (e.g., top surface) of the substrate 104. The second integrated device 107 may be coupled to the substrate 104 through the plurality of solder interconnects 170. A solder reflow process may be used to couple the second integrated device 107 to the substrate 104.

Stage 6, as shown in FIG. 12C, illustrates a state after a third integrated device 109 is coupled to the first surface (e.g., top surface) of the substrate 104. The third integrated device 109 may be coupled to the substrate 104 through the plurality of solder interconnects 190. A solder reflow process may be used to couple the third integrated device 109 to the substrate 104. The third integrated device 109 may be located over the second integrated device 107. The second integrated device 107 may be located between the third integrated device 109 and the substrate 104. The plurality of channel interconnects 408 from the plurality of channel substrates 608 may be located between solder interconnects from the plurality of solder interconnects 190. The plurality of solder interconnects 190 may laterally surround the second integrated device 107.

Stage 7 illustrates a state after a plurality of solder interconnects 110 is coupled to the second surface of the substrate 102. A solder reflow process may be used to couple the plurality of solder interconnects 110 to the substrate 102. Stage 7 may illustrate the package 600 that includes the plurality of channel substrates 608 that includes the plurality of channel interconnects 408, as described at least in FIG. 6. The package 600 may be fabricated one at a time or may be fabricated together in part or as a whole as part of one or more strips or panels and then assembled or singulated into individual packages.

Figure 13:
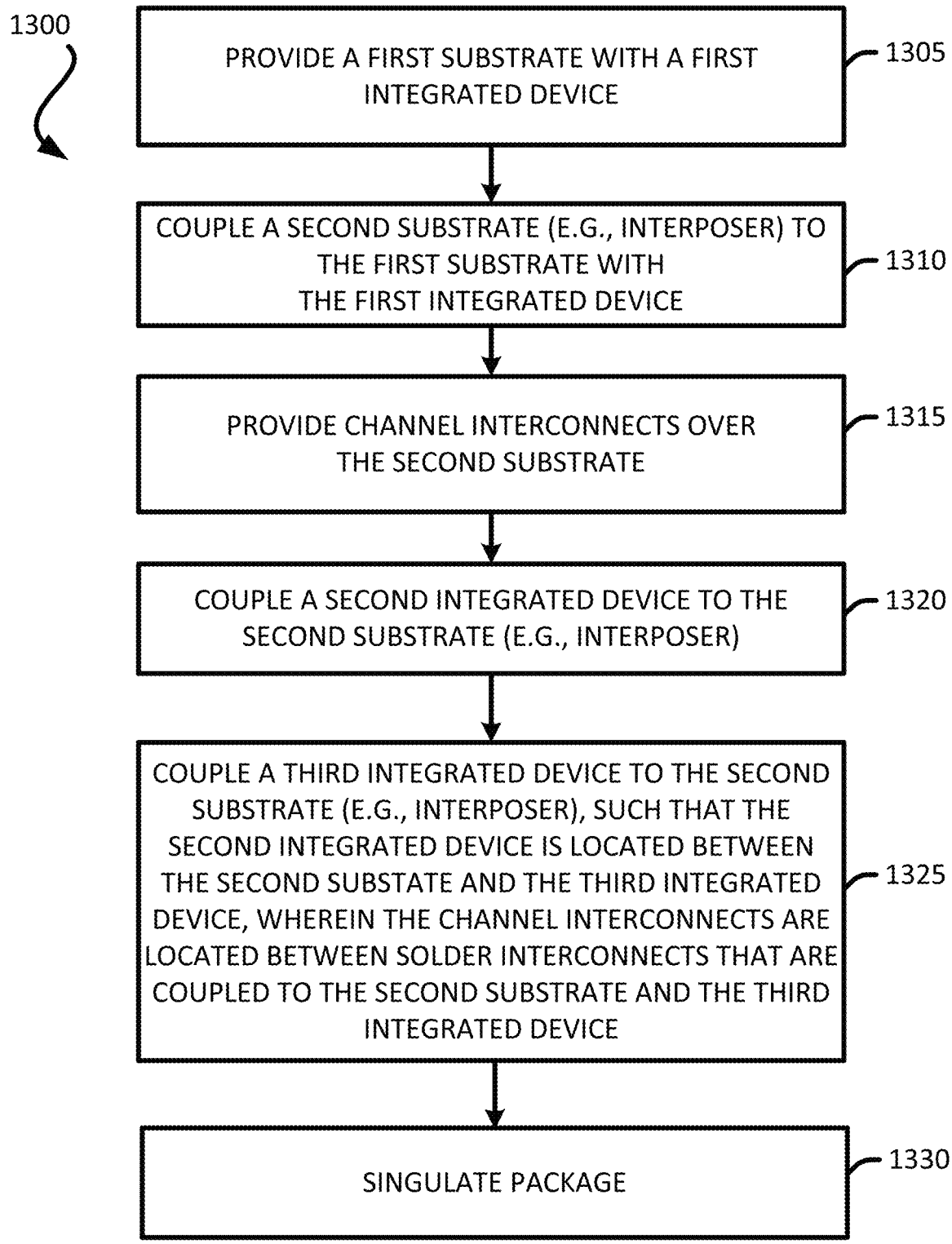
FIG. 13 illustrates an exemplary flow chart of a method for fabricating a package comprising channel interconnections.

Exemplary Flow Diagram of a Method for Fabricating a Package Comprising Channel Interconnects In some implementations, fabricating a package includes several processes. FIG. 13 illustrates an exemplary flow diagram of a method 1300 for providing or fabricating a package comprising channel interconnects. In some implementations, the method 1300 of FIG. 13 may be used to provide or fabricate the packages 100, 400, 600, 800 and/or 1000 described in the disclosure. The method 1300 may be used to provide or fabricate any of the packages described in the disclosure.

It should be noted that the method of FIG. 13 may combine one or more processes in order to simplify and/or clarify the method for providing or fabricating a package. In some implementations, the order of the processes may be changed or modified.

The method provides (at 1305) a first substrate (e.g., 102) and a first integrated device (e.g., 105) coupled to a first surface of the first substrate (e.g., 102). The first substrate 102 and the first integrated device 105 may be part of a first package 101. The first substrate 102 includes at least one first dielectric layer 120 and a first plurality of interconnects 122. Stage 2 of FIG. 11A illustrates and describes an example of a first substrate with a first integrated device. Stage 2 of FIG. 12A illustrates and describes an example of a first substrate with a first integrated device.

The method couples (at 1310) a second substrate (e.g., 104) to the first substrate (e.g., 102) through a plurality of solder interconnects (e.g., 112). The second substrate may include an interposer. The second substrate 104 includes at least one second dielectric layer 140 and a second plurality of interconnects 142. A solder reflow process may be used to couple the second substrate to the first substrate. Stage 3 of FIG. 11A illustrates and describes an example of a second substrate coupled to a first substrate. Stage 3 of FIG. 12A illustrates and describes an example of a second substrate coupled to a first substrate.

The method provides (at 1315) a plurality of channel interconnects over the first surface (e.g., top surface) of the second substrate 104. Different implementations may provide the plurality of channel interconnects differently. In some implementations, the plurality of channel interconnects 408 is formed over the second substrate 104 through a printing process (e.g., inkjet printing process), as described in Stage 4 of FIG. 11B. In some implementations, the plurality of channel interconnects 408 is part of a plurality of channel substrates 608 that is coupled to the second substrate 104, as described in Stage 4 of FIG. 12B. In some implementations, the plurality of channel interconnects 408 is part of a plurality of flexible cables 808 that is coupled to the second substrate 104, as described in Stage 4 of FIG. 12B. It is noted that the method may provide the plurality of channel interconnects over and/or under different surfaces of the first substrate 102 and/or the second substrate 104.

The method couples (at 1320) a second integrated device (e.g., 107) to the first surface of the second substrate (e.g., 104) through a plurality of solder interconnects (e.g., 170). A solder reflow process may be used to couple the second integrated device to the first surface of the second substrate 104. Stage 5 of FIG. 11B illustrates and describes an example of a second integrated device coupled to a second substrate. Stage 5 of FIG. 12B illustrates and describes an example of a second integrated device coupled to a second substrate.

The method couples (at 1325) a third integrated device (e.g., 109) to the first surface of the second substrate (e.g., 104) through a plurality of solder interconnects (e.g., 190). A solder reflow process may be used to couple the third integrated device to the first surface of the second substrate 104. The third integrated device 109 may be located over the second integrated device 107. The second integrated device 107 may be located between the third integrated device 109 and the substrate 104. The plurality of channel interconnects 408 may be located between solder interconnects from the plurality of solder interconnects 190. The plurality of channel interconnects 408 from the plurality of channel substrates 608 may be located between solder interconnects from the plurality of solder interconnects 190. The plurality of channel interconnects 408 from the plurality of flexible cables 808 may be located between solder interconnects from the plurality of solder interconnects 190. The plurality of solder interconnects 190 may laterally surround the second integrated device 107.

In some implementations, several packages are fabricated at the same time. In such cases, the method may singulate (at 1330) the package (e.g., 100, 400, 600, 800, 1000). In other cases, singulation happens before substrates are couple to each other.

Exemplary Sequence for Fabricating a Substrate

Figure 14A:
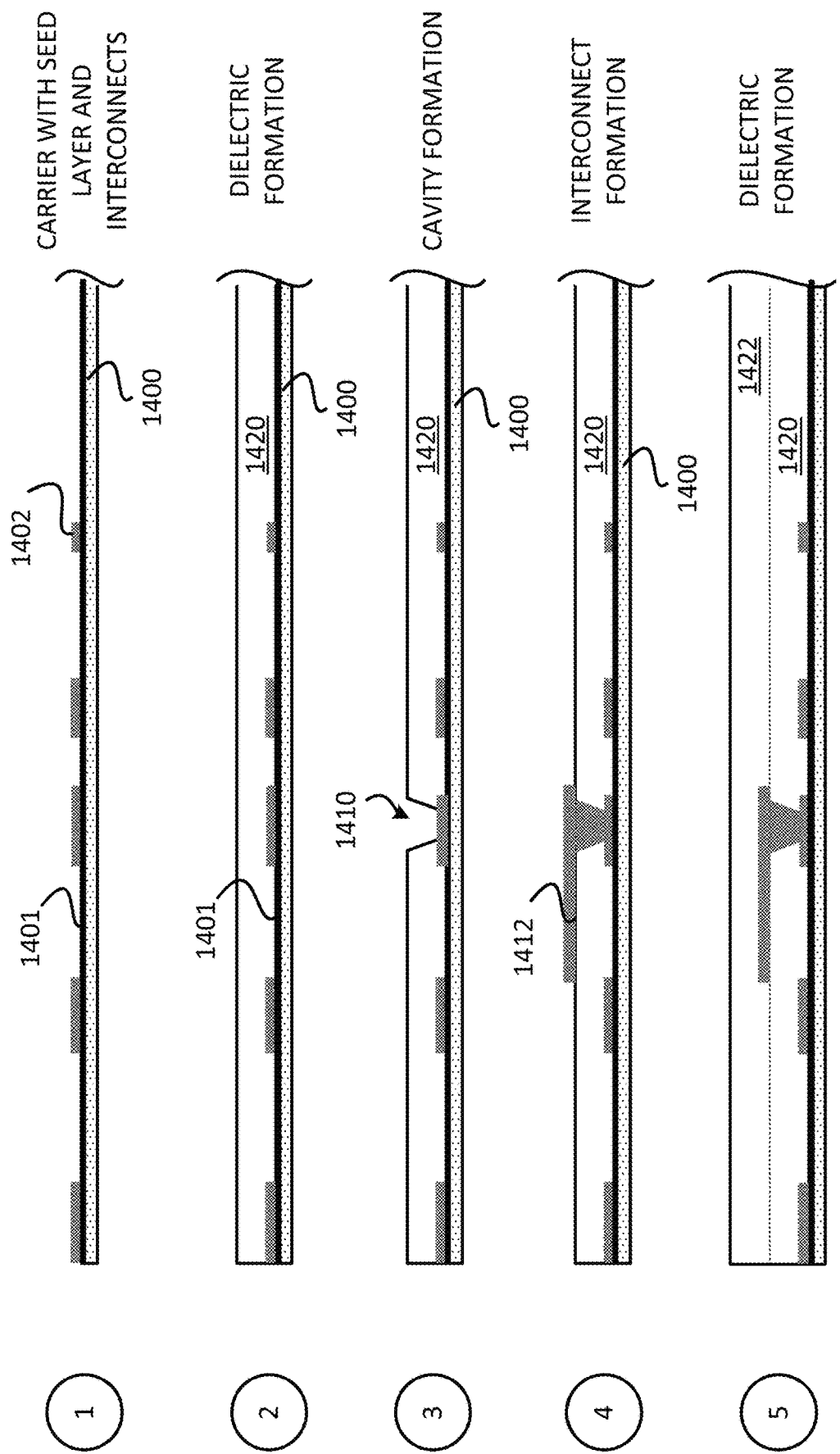
FIGS. 14A-14B illustrate an exemplary sequence for fabricating a substrate.
Figure 14B:
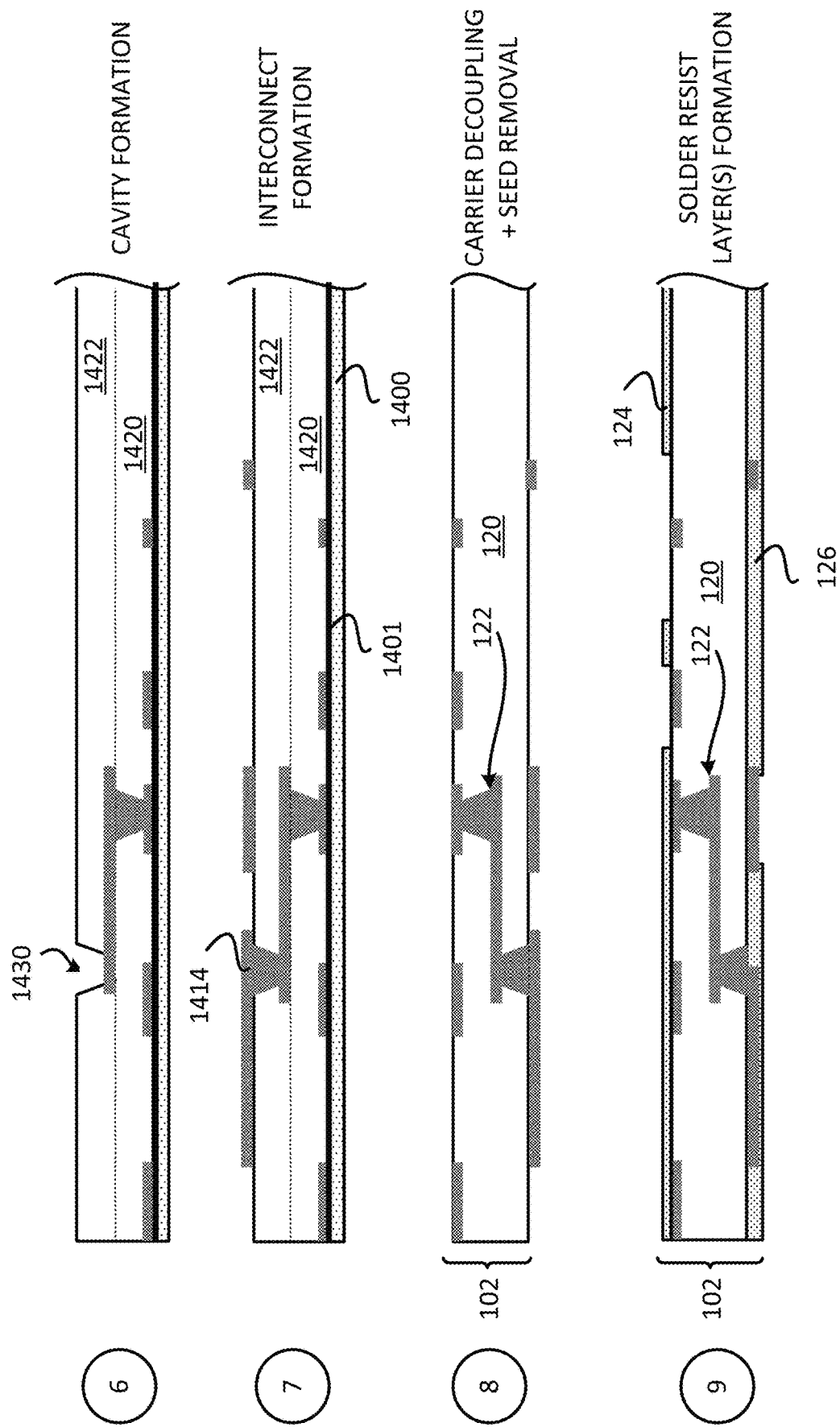

In some implementations, fabricating a substrate includes several processes. FIGS. 14A-14B illustrate an exemplary sequence for providing or fabricating a substrate. In some implementations, the sequence of FIGS. 14A-14B may be used to provide or fabricate the substrate 102. However, the process of FIGS. 14A-14B may be used to fabricate any of the substrates described in the disclosure, such as the substrate 104 and/or the channel substrate 608.

It should be noted that the sequence of FIGS. 14A-14B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 14A, illustrates a state after a carrier 1400 is provided. A seed layer 1401 and interconnects 1402 may be located over the carrier 1400. The interconnects 1402 may be located over the seed layer 1401. A plating process and etching process may be used to form the interconnects 1402. In some implementations, the carrier 1400 may be provided with the seed layer 1401 and a metal layer that is patterned to form the interconnects 1402. The interconnects 1402 may represent at least some of the interconnects from the plurality of interconnects 122.

Stage 2 illustrates a state after a dielectric layer 1420 is formed over the carrier 1400, the seed layer 1401 and the interconnects 1402. A deposition and/or lamination process may be used to form the dielectric layer 1420. The dielectric layer 1420 may include prepreg and/or polyimide. The dielectric layer 1420 may include a photo-imageable dielectric. However, different implementations may use different materials for the dielectric layer.

Stage 3 illustrates a state after a plurality of cavities 1410 is formed in the dielectric layer 1420. The plurality of cavities 1410 may be formed using an etching process (e.g., photo etching process) or laser process.

Stage 4 illustrates a state after interconnects 1412 are formed in and over the dielectric layer 1420, including in and over the plurality of cavities 1410. For example, a via, pad and/or traces may be formed. A plating process may be used to form the interconnects.

Stage 5 illustrates a state after a dielectric layer 1422 is formed over the dielectric layer 1420 and the interconnects 1412. A deposition and/or lamination process may be used to form the dielectric layer 1422. The dielectric layer 1422 may include prepreg and/or polyimide. The dielectric layer 1422 may include a photo-imageable dielectric. However, different implementations may use different materials for the dielectric layer.

Stage 6, as shown in FIG. 14B, illustrates a state after a plurality of cavities 1430 is formed in the dielectric layer 1422. The plurality of cavities 1430 may be formed using an etching process (e.g., photo etching process) or laser process.

Stage 7 illustrates a state after interconnects 1414 are formed in and over the dielectric layer 1422, including in and over the plurality of cavities 1430. For example, a via, pad and/or traces may be formed. A plating process may be used to form the interconnects. The plurality of interconnects 1402, the plurality of interconnects 1412, and/or the plurality of interconnects 1414 may be represented by the plurality of interconnects 122. The dielectric layer 1420 and/or the dielectric layer 1422 may be represented by the at least one dielectric layer 120. The at least one dielectric layer 120 may include a photo-imageable dielectric. The at least one dielectric layer 120 may include prepreg and/or polyimide.

Stage 8 illustrates a state after the carrier 1400 is decoupled (e.g., detached, removed, grinded out) from at least one dielectric layer 120 and the seed layer 1401, portions of the seed layer 1401 are removed (e.g., etched out), leaving the substrate 102 that includes at least one dielectric layer 120 and the plurality of interconnects 122.

In some implementations, a substrate may include solder resist layer(s). Stage 9 illustrates a state after the solder resist layer 124 and the solder resist layer 126 are formed over the substrate 102. A deposition process may be used to form the solder resist layer 124 and the solder resist layer 126. In some implementations, none or one solder resist layer may be formed over the at least one dielectric layer 120.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

Figure 15:
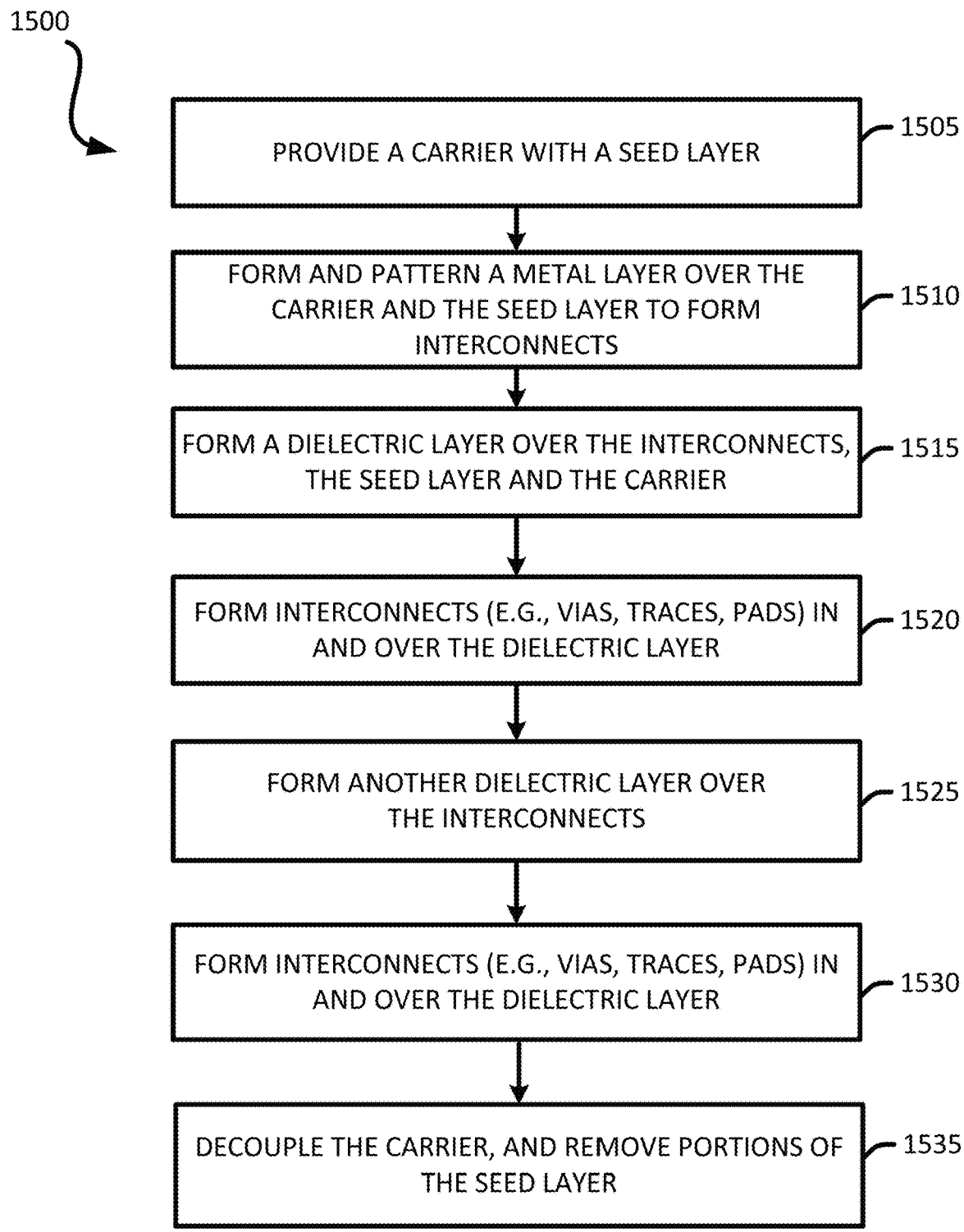
FIG. 15 illustrates an exemplary flow chart of a method for fabricating a substrate.

In some implementations, fabricating a substrate includes several processes. FIG. 15 illustrates an exemplary flow diagram of a method 1500 for providing or fabricating a substrate. In some implementations, the method 1500 of FIG. 15 may be used to provide or fabricate the substrate(s) of the disclosure. For example, the method 1500 of FIG. 15 may be used to fabricate the substrate 102.

It should be noted that the method 1500 of FIG. 15 may combine one or more processes in order to simplify and/or clarify the method for providing or fabricating a substrate. In some implementations, the order of the processes may be changed or modified.

The method provides (at 1505) a carrier (e.g., 1400). Different implementations may use different materials for the carrier 1400. The carrier 1400 may include a seed layer (e.g., 1401). The seed layer 1401 may include a metal (e.g., copper). The carrier may include a substrate, glass, quartz and/or carrier tape. Stage 1 of FIG. 14A illustrates and describes an example of a carrier with a seed layer that is provided.

The method forms and patterns (at 1510) interconnects over the carrier 1400 and the seed layer 1401. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 402). Stage 1 of FIG. 14A illustrates and describes an example of forming and patterning interconnects over a seed layer and a carrier.

The method forms (at 1515) a dielectric layer 1420 over the seed layer 1401, the carrier 1400 and the interconnects 1402. A deposition and/or lamination process may be used to form the dielectric layer 1420. The dielectric layer 1420 may include prepreg and/or polyimide. The dielectric layer 1420 may include a photo-imageable dielectric. Forming the dielectric layer 1420 may also include forming a plurality of cavities (e.g., 1410) in the dielectric layer 1420. The plurality of cavities may be formed using an etching process (e.g., photo etching) or laser process. Stages 2-3 of FIG. 14A illustrate and describe an example of forming a dielectric layer and cavities in the dielectric layer.

The method forms (at 1520) interconnects in and over the dielectric layer. For example, the interconnects 1412 may be formed in and over the dielectric layer 1420. A plating process may be used to form the interconnects. Forming interconnects may include providing a patterned metal layer over and/or in the dielectric layer. Forming interconnects may also include forming interconnects in cavities of the dielectric layer. Stage 4 of FIG. 14A illustrates and describes an example of forming interconnects in and over a dielectric layer.

The method forms (at 1525) a dielectric layer 1422 over the dielectric layer 1420 and the interconnects 1412. A deposition and/or lamination process may be used to form the dielectric layer 1422. The dielectric layer 1422 may include prepreg and/or polyimide. The dielectric layer 1422 may include a photo-imageable dielectric. Forming the dielectric layer 1422 may also include forming a plurality of cavities (e.g., 1430) in the dielectric layer 1422. The plurality of cavities may be formed using an etching process (e.g., photo etching) or laser process. Stages 5-6 of FIGS. 14A-14B illustrate and describe an example of forming a dielectric layer and cavities in the dielectric layer.

The method forms (at 1530) interconnects in and over the dielectric layer. For example, the interconnects 1414 may be formed in and over the dielectric layer 1422. A plating process may be used to form the interconnects. Forming interconnects may include providing a patterned metal layer over and/or in the dielectric layer. Forming interconnects may also include forming interconnects in cavities of the dielectric layer. Stage 7 of FIG. 14B illustrates and describes an example of forming interconnects in and over a dielectric layer.

The method decouples (at 1535) the carrier (e.g., 1400) from the seed layer (e.g., 1401). The carrier 1400 may be detached and/or grinded off. The method may also remove (at 1535) portions of the seed layer (e.g., 1401). An etching process may be used to remove portions of the seed layer 1401. Stage 8 of FIG. 14B illustrates and describes an example of decoupling a carrier and seed layer removal.

In some implementations, the method may form solder resist layer(s) over a first surface and/or a second surface of the substrate. Stage 9 of FIG. 14B illustrates and describes an example of forming solder resist layer(s).

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 16:
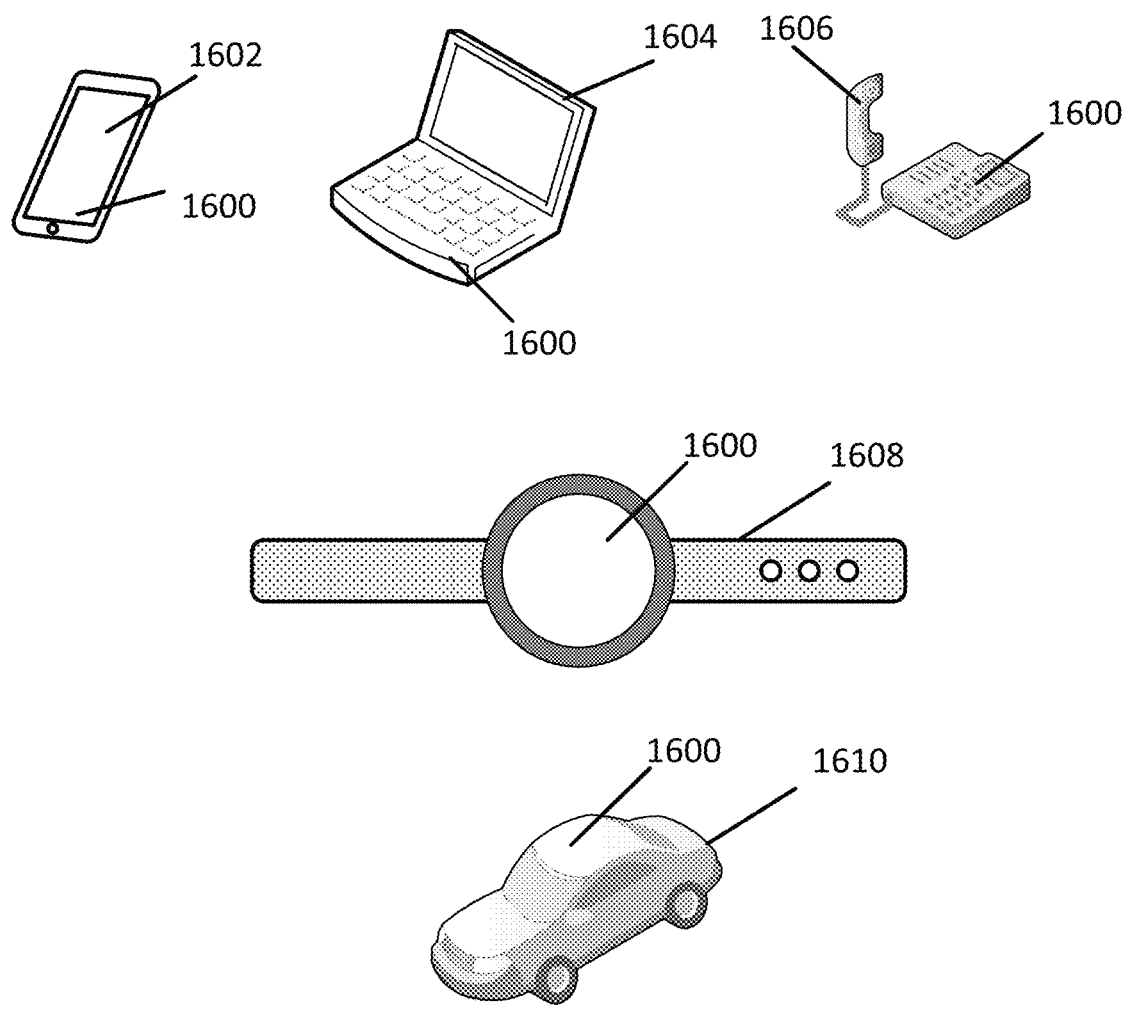
FIG. 16 illustrates various electronic devices that may integrate a die, an electronic circuit, an integrated device, an integrated passive device (IPD), a passive component, a package, and/or a device package described herein.

FIG. 16 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or integrated circuit (IC) packages described herein. The devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-10, 11A-11C, 12A-12C, 13, 14A-14B and 15-16 may be rearranged and/or combined into a single component, process, feature or function or embodied in several components, processes, or functions. Additional elements, components, processes, and/or functions may also be added without departing from the disclosure. It should also be noted FIGS. 1-10, 11A-11C, 12A-12C, 13, 14A-14B and 15-16 and its corresponding description in the present disclosure is not limited to dies and/or ICs. In some implementations, FIGS. 1-10, 11A-11C, 12A-12C, 13, 14A-14B and 15-16 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. As used in the disclosure, a first object that surrounds a second object may mean that the first object partially surrounds the second object or completely surrounds the second object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A device comprising a first package and a second package coupled to the first package through a first plurality of solder interconnects. The first package includes a first substrate comprising at least one first dielectric layer and a first plurality of interconnects, and a first integrated device coupled to the first substrate. The second package includes a second substrate comprising at least one second dielectric layer and a second plurality of interconnects; a second integrated device coupled to a first surface of the second substrate; a third integrated device coupled to the first surface of the second substrate through a second plurality of solder interconnects; and a first plurality of channel interconnects coupled to the first surface of the second substrate, wherein the first plurality of channel interconnects is located between solder interconnects from the second plurality of solder interconnects.

Aspect 2: The device of aspect 1, wherein the second integrated device is located between the third integrated device and the second substrate.

Aspect 3: The device of aspects 1 through 2, further comprising a fourth substrate coupled to the first surface of the second substrate, wherein the first plurality of channel interconnects is part of the fourth substrate.

Aspect 4: The device of aspects 1 through 3, further comprising a flexible cable coupled to the first surface of the second substrate, wherein the first plurality of channel interconnects is part of the flexible cable.

Aspect 5: The device of aspects 1 through 4, wherein the first plurality of channel interconnects extends underneath the third integrated device.

Aspect 6: The device of aspects 1 through 5, wherein a first electrical path between the second integrated device and the first substrate includes the first plurality of channel interconnects.

Aspect 7: The device of aspects 1 through 6, wherein a first electrical path between the second integrated device and the first substrate comprises: at least one first solder interconnect coupling the second integrated device to the second substrate; at least one first interconnect from the second plurality of interconnects of the second substrate; at least one channel interconnect from the first plurality of channel interconnects; at least one second interconnect from the second plurality of interconnects of the second substrate; at least one second solder interconnect from the first plurality of solder interconnects coupling the second substrate and the first substrate; and at least one interconnect from the first plurality of interconnects of the first substrate.

Aspect 8: The device of aspects 1 through 7, further comprising a second plurality of channel interconnects coupled to a second surface of the second substrate.

Aspect 9: The device of aspects 1 through 8, further comprising a second plurality of channel interconnects coupled to a first surface of the first substrate.

Aspect 10: The device of aspects 8 through 9, wherein the second plurality of channel interconnects is part of a fourth substrate and/or a flexible cable.

Aspect 11: An apparatus comprising a first package and a second package coupled to the first package through a first plurality of solder interconnects. The first package includes a first substrate comprising at least one first dielectric layer and a first plurality of interconnects; and a first integrated device coupled to the first substrate. The second package includes a second substrate comprising at least one second dielectric layer and a second plurality of interconnects; a second integrated device coupled to a first surface of the second substrate; a third integrated device coupled to the first surface of the second substrate through a second plurality of solder interconnects; and means for channel interconnections coupled to the first surface of the second substrate, wherein the means for channel interconnections is located between solder interconnects from the second plurality of solder interconnects.

Aspect 12: The apparatus of aspect 11, wherein the second integrated device is located between the third integrated device and the second substrate.

Aspect 13: The apparatus of aspects 11 through 12, wherein the means for channel interconnections includes a fourth substrate.

Aspect 14: The apparatus of aspects 11 through 13, wherein the means for channel interconnections includes a flexible cable.

Aspect 15: The apparatus of aspects 11 through 14, wherein the means for channel interconnections extends underneath the third integrated device.

Aspect 16: The apparatus of aspects 11 through 15, wherein a first electrical path between the second integrated device and the first substrate includes the means for channel interconnection.

Aspect 17: The apparatus of aspects 11 through 16, wherein a first electrical path between the second integrated device and the first substrate comprises at least one first solder interconnect coupling the second integrated device to the second substrate; at least one first interconnect from the second plurality of interconnects of the second substrate; the means for channel interconnection; at least one second interconnect from the second plurality of interconnects of the second substrate; at least one second solder interconnect from the first plurality of solder interconnects coupling the second substrate and the first substrate; and at least one interconnect from the first plurality of interconnects of the first substrate.

Aspect 18: The apparatus of aspects 11 through 17, further comprising a second means for channel interconnections coupled to a second surface of the second substrate.

Aspect 19: The apparatus of aspects 11 through 18, further comprising a second means for channel interconnections coupled to a first surface of the first substrate.

Aspect 20: The apparatus of aspects 11 through 19, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method that provides a first package that includes a first substrate comprising at least one first dielectric layer and a first plurality of interconnects; and a first integrated device coupled to the first substrate. The method couples a second substrate to the first substrate through a first plurality of solder interconnects, wherein the second substrate comprises at least one second dielectric layer and a second plurality of interconnects. The method provides a first plurality of channel interconnects over a first surface of the second substrate. The method couples a second integrated device to the first surface of the second substrate. The method couples a third integrated device to the first surface of the second substrate through a second plurality of solder interconnects, wherein the first plurality of channel interconnects is located between solder interconnects from the second plurality of solder interconnects.

Aspect 22: The method of aspect 21, wherein the second integrated device is located between the third integrated device and the second substrate.

Aspect 23: The method of aspects 21 through 22, wherein providing the first plurality of channel interconnects comprises coupling a fourth substrate comprising the first plurality of channel interconnects, to the first surface of the second substrate.

Aspect 24: The method of aspects 21 through 23, wherein providing the first plurality of channel interconnects comprises coupling a flexible cable comprising the first plurality of channel interconnects, to the first surface of the second substrate.

Aspect 25: The method of aspects 21 through 24, wherein the first plurality of channel interconnects extends underneath the third integrated device.

Aspect 26: A device comprising a package that includes a substrate comprising at least one dielectric layer and a plurality of interconnects, and an integrated device coupled to the substrate. The device includes a first plurality of channel interconnects coupled to a first surface of the substrate.

Aspect 27: The device of aspect 26, further comprising another substrate coupled to the first surface of the substrate, wherein the first plurality of channel interconnects is part of the another substrate.

Aspect 28: The device of aspects 26 through 27, further comprising a flexible cable coupled to the first surface of the substrate, wherein the first plurality of channel interconnects is part of the flexible cable.

Aspect 29: The device of aspects 26 through 28, wherein a first electrical path to/from the integrated device includes the first plurality of channel interconnects.

Aspect 30: The device of aspects 26 through 29, wherein a first electrical path to/from the integrated device includes at least one first solder interconnect coupling the integrated device to the substrate; at least one first interconnect from the plurality of interconnects of the substrate; at least one channel interconnect from the first plurality of channel interconnects; at least one second interconnect from the plurality of interconnects of the substrate.

Aspect 31: The device of aspects 26 through 30, further comprising a second plurality of channel interconnects coupled to a second surface of the substrate.

Aspect 32: The device of aspect 31, wherein the second plurality of channel interconnects is part of a fourth substrate and/or a flexible cable.

Aspect 33: The device of aspects 1 through 32, further comprises another integrated device coupled to the first surface of the substrate through a second plurality of solder interconnects, wherein the first plurality of channel interconnects is located between solder interconnects from the second plurality of solder interconnects, wherein the another integrated device is located over the integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a first package comprising:
a first substrate comprising at least one first dielectric layer and a first plurality of interconnects; and
a first integrated device coupled to the first substrate; and
a second package comprising:
a second substrate comprising at least one second dielectric layer and a second plurality of interconnects, wherein the second substrate is coupled to the first substrate through a first plurality of solder interconnects;
a second integrated device coupled to a first surface of the second substrate;
a third integrated device coupled to the first surface of the second substrate through a second plurality of solder interconnects; and
a first plurality of channel interconnects coupled to the first surface of the second substrate, wherein the first plurality of channel interconnects is located laterally between solder interconnects from the second plurality of solder interconnects.

2. The device of claim 1, wherein the second integrated device is located between the third integrated device and the second substrate.

3. The device of claim 1, further comprising a fourth substrate coupled to the first surface of the second substrate, wherein the first plurality of channel interconnects is part of the fourth substrate.

4. The device of claim 1, further comprising a flexible cable coupled to the first surface of the second substrate, wherein the first plurality of channel interconnects is part of the flexible cable.

5. The device of claim 1,
wherein the first plurality of channel interconnects extends underneath the third integrated device, and
wherein the first plurality of channel interconnects are located vertically between the first substrate and the second substrate.

6. The device of claim 1, wherein a first electrical path between the second integrated device and the first substrate includes the first plurality of channel interconnects.

7. The device of claim 1, wherein a first electrical path between the second integrated device and the first substrate comprises:
- at least one first solder interconnect coupling the second integrated device to the second substrate;
- at least one first interconnect from the second plurality of interconnects of the second substrate;
- at least one channel interconnect from the first plurality of channel interconnects;
- at least one second interconnect from the second plurality of interconnects of the second substrate;
- at least one second solder interconnect from the first plurality of solder interconnects coupling the second substrate and the first substrate; and
- at least one interconnect from the first plurality of interconnects of the first substrate.

8. The device of claim 1, further comprising a second plurality of channel interconnects coupled to a second surface of the second substrate.

9. The device of claim 1, further comprising a second plurality of channel interconnects coupled to a first surface of the first substrate.

10. The device of claim 9, wherein the second plurality of channel interconnects is part of a fourth substrate and/or a flexible cable.

11. An apparatus comprising:
a first package comprising:
- a first substrate comprising at least one first dielectric layer and a first plurality of interconnects; and
- a first integrated device coupled to the first substrate; and a second package comprising:
- a second substrate comprising at least one second dielectric layer and a second plurality of interconnects, wherein the second substrate is coupled to the first substrate through a first plurality of solder interconnects;
- a second integrated device coupled to a first surface of the second substrate;
- a third integrated device coupled to the first surface of the second substrate through a second plurality of solder interconnects; and
- means for channel interconnections coupled to the first surface of the second substrate, wherein the means for channel interconnections is located laterally between solder interconnects from the second plurality of solder interconnects.

12. The apparatus of claim 11, wherein the second integrated device is located between the third integrated device and the second substrate.

13. The apparatus of claim 11, wherein the means for channel interconnections includes a fourth substrate.

14. The apparatus of claim 11, wherein the means for channel interconnections includes a flexible cable.

15. The apparatus of claim 11,
- wherein the means for channel interconnections extends underneath the third integrated device, and
- wherein the means for channel interconnections are located vertically between the first substrate and the second substrate.

16. The apparatus of claim 11, wherein a first electrical path between the second integrated device and the first substrate includes the means for channel interconnection.

17. The apparatus of claim 11, wherein a first electrical path between the second integrated device and the first substrate comprises:
- at least one first solder interconnect coupling the second integrated device to the second substrate;
- at least one first interconnect from the second plurality of interconnects of the second substrate;
- the means for channel interconnection;
- at least one second interconnect from the second plurality of interconnects of the second substrate;
- at least one second solder interconnect from the first plurality of solder interconnects coupling the second substrate and the first substrate; and
- at least one interconnect from the first plurality of interconnects of the first substrate.

18. The apparatus of claim 11, further comprising a second means for channel interconnections coupled to a second surface of the second substrate.

19. The apparatus of claim 11, further comprising a second means for channel interconnections coupled to a first surface of the first substrate.

20. The apparatus of claim 11, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

\* \* \* \* \*